(12) United States Patent
Ge

(10) Patent No.: US 10,554,223 B2
(45) Date of Patent: Feb. 4, 2020

(54) APPARATUS AND METHODS FOR POLAR CODE CONSTRUCTION

(71) Applicant: Yiqun Ge, Kanata (CA)

(72) Inventor: Yiqun Ge, Kanata (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 92 days.

(21) Appl. No.: 15/838,559

(22) Filed: Dec. 12, 2017

(65) Prior Publication Data

US 2018/0183464 A1 Jun. 28, 2018

Related U.S. Application Data

(60) Provisional application No. 62/438,550, filed on Dec. 23, 2016.

(51) Int. Cl.
| | | |
|---|---|---|
| *H03M 13/13* | (2006.01) | |
| *H03M 13/09* | (2006.01) | |
| *H04L 1/00* | (2006.01) | |
| *H03M 13/00* | (2006.01) | |

(52) U.S. Cl.
CPC ....... *H03M 13/134* (2013.01); *H03M 13/096* (2013.01); *H04L 1/0013* (2013.01); *H04L 1/0061* (2013.01); *H04L 1/0069* (2013.01); *H03M 13/618* (2013.01)

(58) Field of Classification Search
CPC .................................................... H03M 13/11
USPC ......................................................... 714/758
See application file for complete search history.

(56) References Cited

U.S. PATENT DOCUMENTS

| | | |
|---|---|---|
| 2014/0331083 A1 | 11/2014 | Aliev et al. |
| 2016/0241258 A1 | 8/2016 | Zeng et al. |
| 2017/0012740 A1 | 1/2017 | Shen et al. |
| 2017/0047947 A1* | 2/2017 | Hong ................ H03M 13/2906 |
| 2017/0366204 A1* | 12/2017 | Shi ........................ H03M 13/09 |

(Continued)

FOREIGN PATENT DOCUMENTS

| | | |
|---|---|---|
| WO | 2015058416 A1 | 4/2015 |
| WO | 2015143593 A1 | 10/2015 |

OTHER PUBLICATIONS

E. Arikan, "Channel polarization: A method for constructing capacity-achieving codes for symmetric binary-input memoryless channels," IEEE Transactions on Information Theory, vol. 55, No. 7, 2009, pp. 3051-3073.

(Continued)

*Primary Examiner* — Fritz Alphonse

(57) ABSTRACT

Input bits are encoded into codewords that include coded bits. Encoding involves applying a first set of polar encoding matrices $G_Y$ of prime number dimension Y to the input bits to produce output bits, and applying a second set of polar encoding matrices $G_Z$ of prime number dimension Z to the output bits to produce the codeword. One or both of $G_X$ and $G_Y$ could be non-2-by-2. Such kernel design and other aspects of code construction, including reliabilities and selection of sub-channels for code construction, non-CRC-aided error correction, and code shortening and puncturing, are discussed in further detail herein.

27 Claims, 19 Drawing Sheets

$$G_2 = \begin{bmatrix} 1 & 0 \\ 1 & 1 \end{bmatrix} \quad G_2^{\otimes 2} = \begin{bmatrix} G_2 & 0 \\ G_2 & G_2 \end{bmatrix} \quad G_2^{\otimes 3} = \begin{bmatrix} G_2 & 0 & 0 & 0 \\ G_2 & G_2 & 0 & 0 \\ G_2 & 0 & G_2 & 0 \\ G_2 & G_2 & G_2 & G_2 \end{bmatrix}$$

$$G_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix} \quad G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

(56) References Cited

U.S. PATENT DOCUMENTS

2018/0048334 A1* 2/2018 Sarkis .................. H03M 13/13
2018/0198564 A1* 7/2018 Yang ................. H03M 13/6356

OTHER PUBLICATIONS

I. Tal, A. Vardy, "List Decoding of Polar Codes", Proceedings of the 2011 IEEE International Symposium on Information Theory, Jul. 2011, 11 pages.

R. Pedarsani, "Polar Codes: Construction and Performance Analysis", Jun. 2011, EPFL master project, 48 pages.

R. Mori, Tanaka T., "Performance and construction of polar codes on symmetric binary-input memoryless channels", IEEE International Symposium on Information Theory, 2009, pp. 1496-1500.

J.Dai, K.Niu, Z.Si, J.Lin, "Evaluation and Optimization of Gaussian Approximation for Polar Codes", May 2016, 4 pages.

P. Trifonov, "Efficient design and decoding of polar codes." IEEE Transactions on Communications 60.11 (2012): pp. 3221-3227.

R1-1611254, "Details of the Polar Code Design", Huawei & HiSilicon, 3GPP TSG RAN WG1 Meeting #87, 33 pages.

Huawei et al, Channel coding for control channels. 3GPP TSG RAN WG1 Meeting #86 Gothenburg, Sweden, Aug. 22-26, 2016, R1-167216, 8 pages.

Gabry, Frederic et al: "Multi-Kernel Construction of Polar Codes" University Library, 201 Olin Library, Ithaca, NY 14853, Dec. 19, 2016, XP080745345, DOI:10.1109/1CCW.2017.7962750, total 4 pages.

Rengaswamy, Narayanan et al:"Cyclic polar Codes", 2015 IEEE International Symposium on Information Theory (ISIT), Jun. 14, 2015, pp. 1287-1291, XP033219981, DO1:10.1109/ISIT.2015.7282663, retrieved on Sep. 28, 2015, total 5 pages.

Huawei et al.,"Polar Code Construction for NR", 3GPP TSG RAN WG1 Meeting #86bis R1-1608862, Lisbon, Portugal, Oct. 10-14, 2016, total 8 pages.

Niu, Kai et al: "Polar codes: Primary concepts and practical decoding algorithms", IEEE Communications Magazine, vol. 52, No. 7, Jul. 2014, pp. 192-203, XP011553413, ISSN:0163-6804, DOI: 10.11091MCOM.2014.6852102, total 12 pages.

Li, Bin et al: "A RM-Polar Codes", Jul. 21, 2014, XP055270198, Retrieved from the Internet at URL:https://alarxiv.org/ftp/arxiv/papers/140711407.5483.pdf, total 2 pages.

Cheng, Nan et al: "Encoder and list decoder of Reed-Solomon kernel based Polar codes", 2016 8TH International Conference on Wireless Communications and Signal Processing (WCSP), IEEE, Oct. 13, 2016 (Oct. 13, 2016), pp. 1-6, XP033002043, [retrieved on Nov. 21, 2016], total 6 pages.

* cited by examiner $$G_2 = \begin{bmatrix} 1 & 0 \\ 1 & 1 \end{bmatrix} \quad G_2^{\otimes 2} = \begin{bmatrix} G_2 & 0 \\ G_2 & G_2 \end{bmatrix} \quad G_2^{\otimes 3} = \begin{bmatrix} G_2 & 0 & 0 & 0 \\ G_2 & G_2 & 0 & 0 \\ G_2 & 0 & G_2 & 0 \\ G_2 & G_2 & G_2 & G_2 \end{bmatrix}$$

$$G_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix}$$

$$G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

FIG. 1

Successive Cancellation Decoding for $i = 0, 1, \ldots, n-1$ do
   if $\hat{u}_i$ is frozen then set $\hat{u}_i$ accordingly;
   else
      if $W_i(\mathbf{y}_0^{n-1}, \hat{u}_0^{i-1}|0) > W_i(\mathbf{y}_0^{n-1}, \hat{u}_0^{i-1}|1)$ then
         set $\hat{u}_i \leftarrow 0$;
      else
         set $\hat{u}_i \leftarrow 1$;

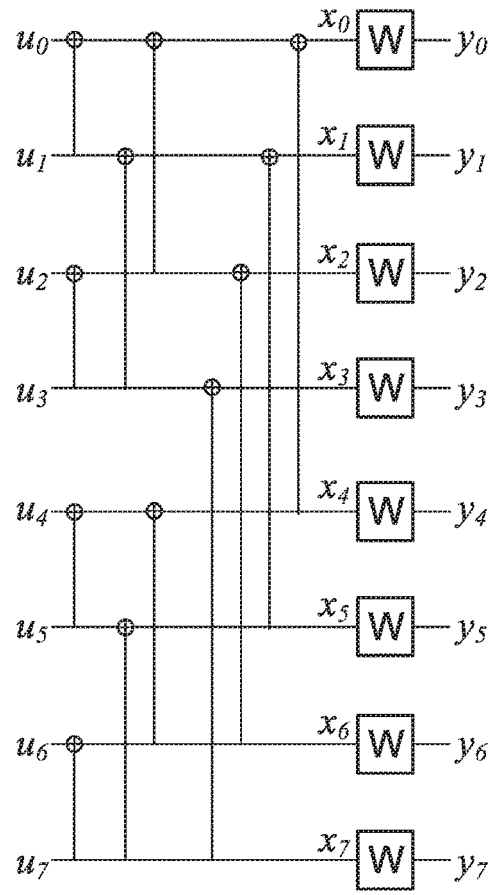

$F = \{0, 1, 2, 4\}$

From 0 till $N - 1$
   if $i \in F$, $\hat{u}_i = 0$
   if $i \in F^c$, $$\hat{u}_i = \begin{cases} 0, & \text{if } \dfrac{P(0|\hat{u}_0^{i-1}, \bar{y})}{P(1|\hat{u}_0^{i-1}, \bar{y})} > 1 \\ 1, & \text{otherwise} \end{cases}$$

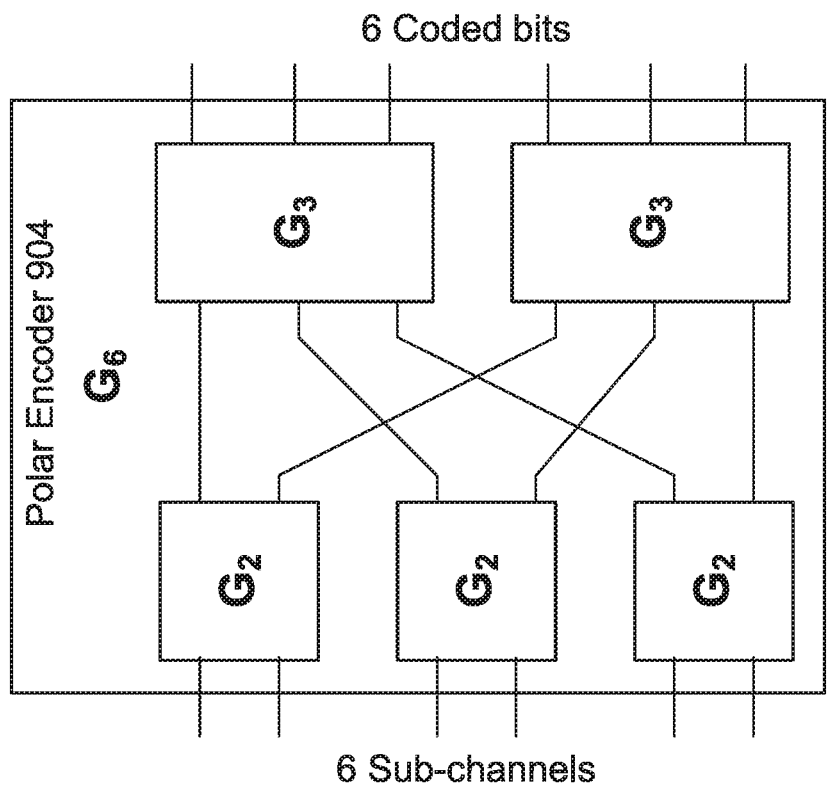
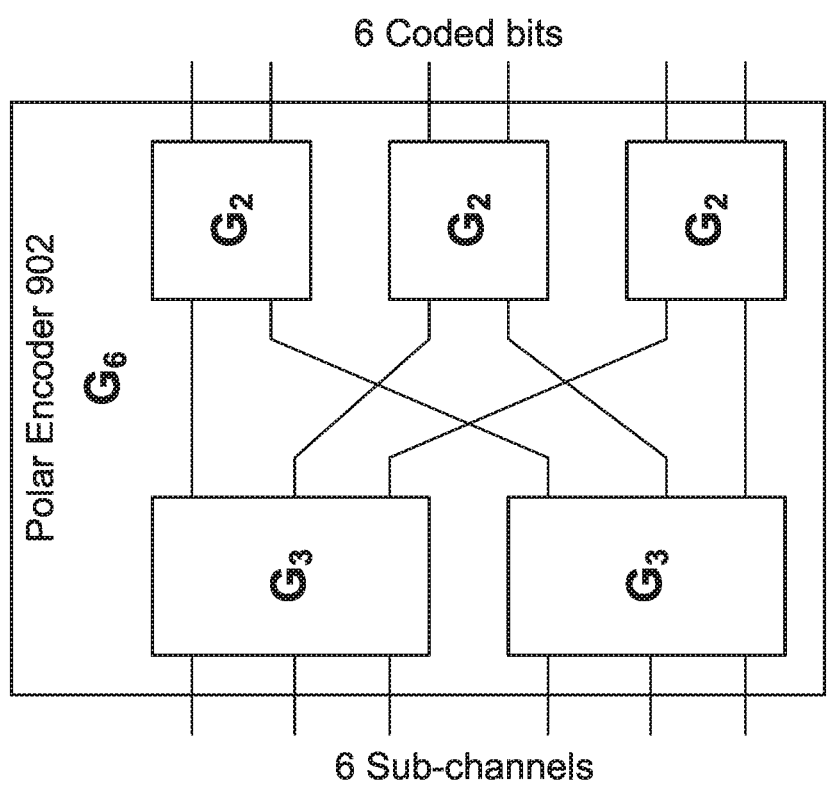
FIG. 9

|   |   |   |   | Hamming Weight | Row Weight |
|---|---|---|---|---|---|
| 1 | 0 | 0 | 0 | 0 | 1 |
| 1 | 1 | 0 | 0 | 1 | 2 |
| 1 | 0 | 1 | 0 | 1 | 2 |
| 1 | 1 | 1 | 1 | 2 | 4 |

Sub-Channel #0
Sub-Channel #1
Sub-Channel #2
Sub-Channel #3

FIG. 12

APPARATUS AND METHODS FOR POLAR CODE CONSTRUCTION

CROSS-REFERENCE TO RELATED APPLICATIONS

The present application claims the benefit of U.S. Provisional Application No. 62/438,550, filed on Dec. 23, 2016, entitled "APPARATUS AND METHODS FOR POLAR CODE CONSTRUCTION", the entire contents of which are incorporated herein by reference.

FIELD

The present disclosure relates to generally to communications and, in particular, to construction of polar codes.

BACKGROUND

Polar codes are proposed as channel codes for use in future wireless communications, and have been selected for uplink and downlink enhanced Mobile Broadband (eMBB) control channel coding for the new $5^{th}$ Generation (5G) air interface, also known as the 5G New Radio (NR). These codes are competitive with state-of-the-art error correction codes and have low encoding complexity. See E. Arikan, "Channel polarization: A method for constructing capacity-achieving codes for symmetric binary-input memoryless channels," IEEE Trans. Inf. Theory, vol. 55, no. 7, pp. 3051-3073, 2009. Successive Cancellation List (SCL) decoding and its extensions (e.g., SC List decoding) are effective and efficient options for decoding polar coded information.

Based on channel polarization, Arikan designed a channel code that is proven to reach channel capacity. Polarization refers to a coding property that, as code length increases to infinity, bit-channels also referred to as sub-channels polarize and their capacities approach either zero (completely noisy channel) or one (completely perfect channel). In other words, bits encoded in high capacity sub-channels will experience a channel with high Signal-to-Noise Ratio (SNR), and will have a relatively high reliability or a high likelihood of being correctly decoded, and bits encoded in low capacity sub-channels will experience a channel with low SNR, and will have low reliability or a low possibility to be correctly decoded. The fraction of perfect bit-channels is equal to the capacity of this channel.

SUMMARY

Illustrative embodiments are disclosed by way of example in the description and claims.

According to one aspect of the present disclosure, an apparatus includes an encoder to produce a codeword with coded bits, and a transmitter, coupled to the encoder, to transmit the codeword. The encoder is configured to apply a first plurality of polar encoding matrices $G_Y$ of prime number dimension Y to input bits to produce output bits, and to apply a second plurality of polar encoding matrices $G_Z$ of prime number dimension Z to the output bits to produce the codeword.

A method according to another aspect involves encoding input bits into a codeword that includes coded bits, and transmitting the codeword. The encoding involves applying a first set of polar encoding matrices $G_Y$ of prime number dimension Y to the input bits to produce output bits, and applying a second set of polar encoding matrices $G_Z$ of prime number dimension Z to the output bits to produce the codeword.

Another aspect provides a non-transitory processor-readable medium storing instructions which, when executed by one or more processors, cause the one or more processors to perform a method. The method, as described herein, involves encoding input bits into a codeword that includes coded bits, and transmitting the codeword, and the encoding involves applying a first set of polar encoding matrices $G_Y$ of prime number dimension Y to the input bits to produce output bits, and applying a second set of polar encoding matrices $G_Z$ of prime number dimension Z to the output bits to produce the codeword.

Other aspects and features of embodiments of the present disclosure will become apparent to those ordinarily skilled in the art upon review of the following description.

BRIEF DESCRIPTION OF THE DRAWINGS

Examples of embodiments of the invention will now be described in greater detail with reference to the accompanying drawings.

FIG. 1 is a diagram showing one example of how a polar coding generator matrix can be produced from a kernel.

FIG. 3 illustrates an example of an SC (Successive Cancellation) decoding algorithm.

FIG. 8 is a diagram showing how polar coding generator matrices can be produced from 3-by-3 kernels.

FIG. 9 includes block diagrams illustrating two example higher dimension encoders based on different types of lower dimension kernel encoders.

FIG. 12 is a block diagram illustrating Hamming weights of and row weights of sub-channels of a 4-by-4 polar code generator matrix.

DETAILED DESCRIPTION

FIG. 1 is a diagram showing, by way of an illustrative example, how a polar coding generator matrix can be produced from a kernel $G_2$ 100. Note that FIG. 1 is an example. In the present disclosure, other forms of kernel are also considered. Polarization comes from the "nested" way in which a generator matrix is created from a kernel (or combination of kernels), in accordance with an aspect of the present disclosure.

A polar code can be formed from a Kronecker product matrix based on a seed matrix $F=G_2$ 100. For a polar code having codewords of length $N=2^m$, the generator matrix is $G_2^{\otimes m}$. The 2-fold Kronecker product matrix $G_2^{\otimes 2}$ 102 and the 3-fold Kronecker product matrix $G_2^{\otimes 3}$ 104 in FIG. 1 are examples of polar coding generator matrices. The generator matrix approach illustrated in FIG. 1 can be expanded to produce an m-fold Kronecker product matrix $G_2^{\otimes m}$.

Figure 2:
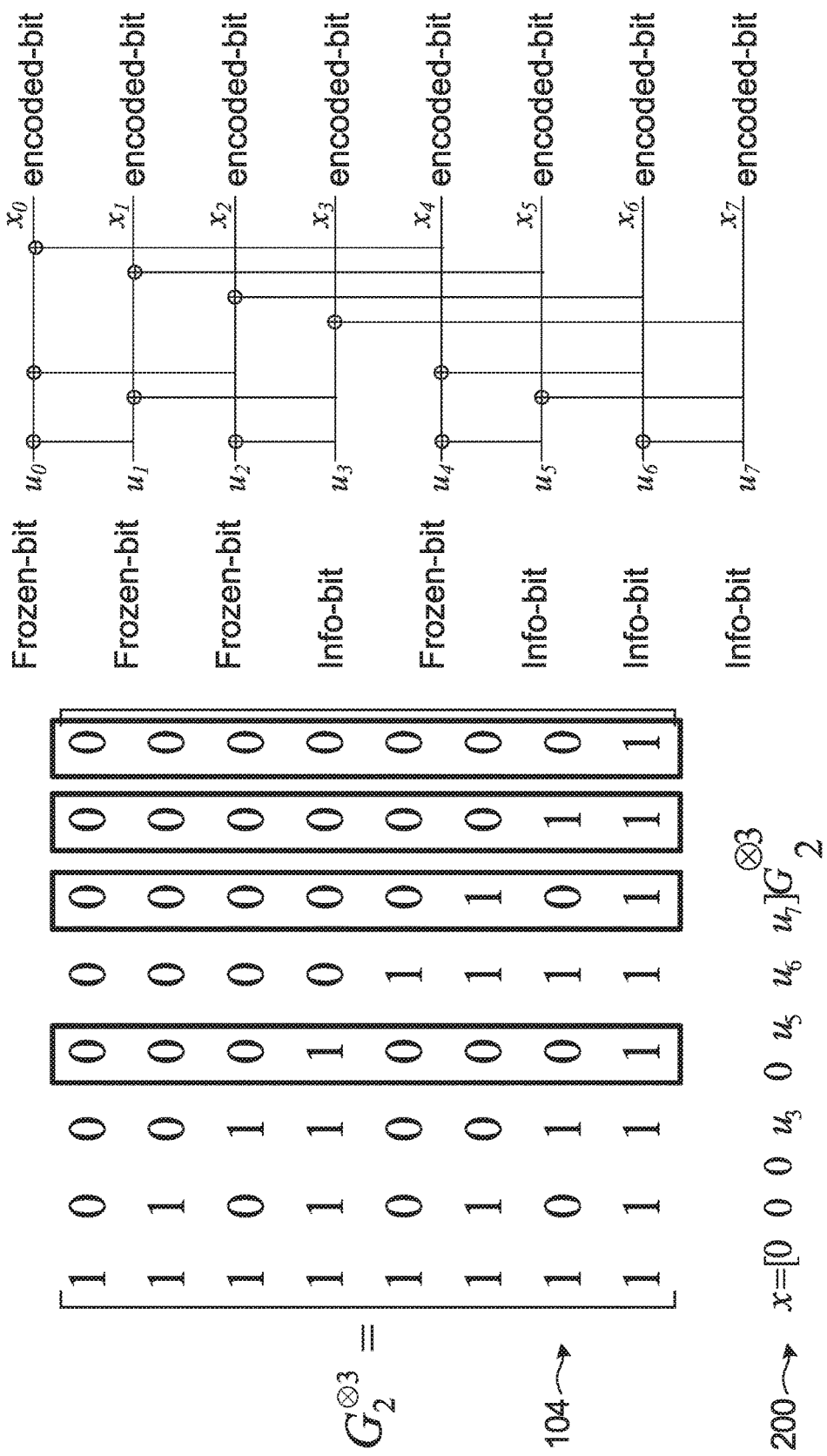
FIG. 2 is a diagram showing an example use of a polar coding generator matrix for producing codewords and a schematic illustration of an example polar encoder.

FIG. 2 is a diagram showing an example use of a polar coding generator matrix for producing codewords and a schematic illustration of an example polar encoder. In FIG. 2, the generator matrix $G_2^{\otimes 3}$ 104 is used to produce codewords of length $2^3=8$. A codeword x is formed by the product of an input vector $u=[0\ 0\ 0\ u_3\ 0\ u_5\ u_6\ u_7]$ and the generator matrix $G_2^{\otimes 3}$ 104 as indicated at 200. The input vector u is composed of information bits and fixed or frozen bits. In the specific example shown in FIG. 2. N=8, so the input vector u is an 8-bit vector, and the codeword x is an 8-bit vector. The input vector has frozen bits in positions 0, 1, 2 and 4, and has information bits at positions 3, 5, 6, and 7. An example implementation of an encoder that generates codewords is indicated at 212, where the frozen bits are all set to 0, and the circled "+" symbols represent modulo 2 addition. For the example of FIG. 2, an N=8-bit input vector is formed from K=4 information bits and N-K=4 frozen bits. Codes of this form are referred to as polar codes and the encoder is referred to as a polar encoder. Decoders for decoding polar codes are referred to as polar decoders. Frozen bits are set to zero in the example shown in FIG. 2. However, frozen bits could be set to other bit values that are known to both an encoder and a decoder. For ease of description, all-zero frozen bits are considered herein, and may be generally preferred.

As is known, polar coding may be performed with or without bit reversal. The example polar encoder in FIG. 2 is without bit reversal.

Generally, the output of a polar encoder can be expressed as $x_0^{N-1}=u_0^{N-1}G_N$, where, without bit reversal, $G_N=F^{\otimes n}$ is an N-by-N generator matrix, $N=2^n$, $n \geq 1$ (e.g. for $n=1$, $G_2=F$ (indicated as 100 in FIG. 1)). For bit reversal, $G_N=B_N F^{\otimes n}$, where $B_N$ is an N-by-N bit-reversal permutation matrix.

Embodiments disclosed herein could be implemented without or with bit reversal.

In polar code construction, ideally the more "reliable" positions of an input vector are used to carry the information bits, and the more "unreliable" positions of an input vector are used to carry the frozen bits (i.e., bits already known to both encoder and decoder). However, when information is transmitted over a physical channel, the reliability of a given bit position is also a function of the characteristics of the physical channel, such as the erasure rate or the Signal-to-Noise Ratio (SNR) of the physical channel. A reliability sequence (reliable and unreliable positions) could be calculated based on assumed or measured characteristics of the physical channel before the information is transmitted over the channel, for example. In theory, the frozen bits can be set to any value as long as the location of each frozen bit is known to both the encoder and the decoder. In conventional applications, the frozen bits are all set to zero.

With a sufficiently long code length, a code designed according to polarization theory can reach the channel capacity in a binary symmetric memoryless channel if a Successive Cancellation (SC) decoding algorithm is used. A very simple SC decoding algorithm was analyzed and simulated by Arikan.

In practice, a code length cannot be infinite and a channel cannot be a binary memoryless channel, and therefore channel capacity cannot be reached by such a simple SC decoder. According to Arikan, the channel capacity can be approached when using SC decoding if a code length is over $2^{20}$ bits in an AWGN channel. Such a long code length is impractical in wireless communications, for example.

Assistant or error-detecting code (EDC) bits can be included in the input vector to assist in decoding. A cyclic redundancy check (CRC) code could be used as an EDC. More than one EDC could be used within one codeword. However, it should be understood that other EDCs, such as a checksum code or a Fletcher Code, may be used. Some EDCs are also error-correcting codes (ECCs).

CRC bits, for example, are generated based on the information bits being transmitted. CRC bits are generally placed in more reliable positions in the input vector, although CRC bits may also or instead be placed in other positions in the input vector. CRC bits may be used in path selection for List decoding, for example, to improve polar code performance. During encoding, an N-bit input vector could be formed from K information bits, including one or more CRC bits, and (N-K) frozen bits. In this example, starting with a number of input bits, a CRC is calculated and appended to the input bits to produce a set of information K bits including the input bits and the CRC bits. The remaining (N-K) frozen bits are inserted to produce an N-bit input vector, where N is a power of 2 in an Arikan polar code. The input vector is then multiplied by a generator matrix for a polar code to produce an N-bit codeword.

The codeword is transmitted over a channel, and a receiver, in turn, receives a word. Due to channel effects such as noise, the received word might not be identical to the transmitted codeword. A decoder attempts to decode the received word to determine information bits in the original input vector.

During decoding of a codeword encoded from an input vector, the locations and values of frozen bits in the input vector are treated as known. For descriptive simplicity, bits of the input vector that are not known to the decoder in advance will be referred to as "unknown" bits. For example, the information bits including any the CRC bits are unknown bits. Some polar decoders use SC decoding as noted above, in which the unknown bits are decoded sequentially and successive cancellation is applied. Once a particular decision has been made regarding how an unknown bit is to be decoded, SC polar decoders do not allow that bit to be changed or corrected, and the decoder moves on to decoding the next unknown bit. FIG. 3 illustrates an example of an SC decoding algorithm.

Another type of polar decoding algorithm, which is an extension of SC polar decoding but with better error correction performance and greater space efficiency, referred to as a List decoder, is described in "List Decoding of Polar Codes" by Tal and Vardy, *Proceedings of the* 2011 *IEEE International Symposium on Information Theory*, pp. 1-5 (July 2011). In a List decoder, successive levels of a binary decision tree are generated, each level corresponding to a decision on a respective unknown bit. Each path in the decision tree from the root node to leaf nodes represents a possible partial decoded sequence of unknown bits and has a corresponding likelihood. Typically, during generation of the decision tree, at each level of the decision tree where the number of paths grows beyond a set threshold L, the L paths having the highest likelihoods are identified, and the remaining paths are discarded. Some List decoders may also make use of CRC bits included in the codeword to assist in decoding. For example, if the codeword includes encoded CRC bits for the previous information bits, then once the decision tree is generated, each of the surviving paths that corresponds to the decoded information bits is checked against the CRC bits represented in each of the surviving paths. The decoder then outputs as a decoded vector the information bits in the surviving path that passes the CRC check. If more than one path passes the CRC check, then the decoder selects for output the path that passes the CRC check and has the highest likelihood, which may be determined according to a metric. If no path passes the CRC check, or if the codeword does not include encoded CRC bits, then the decoder selects for output the path that has the highest likelihood, which as noted above may be determined according to a metric.

Thus, there are two types of the decoding based on successive cancellation, including SC decoding and List decoding, which is also referred to as SCL decoding. For every decoded bit, a decoding path generates 2 leaf branches (bit=0|1) for the next decoding bit. An SC decoder tracks only one decoding path. After the value of a decoded bit is estimated, the other possible value is ignored. Decoding continues with the next bit, assuming that each previous bit has been correctly estimated when updating partial sum results.

Although tracking multiple decoding paths as in SCL decoding may offer better decoding performance than single-path tracking as in SC decoders, multi-path decoder size and complexity increases with codeword length and with list size L. For example, for a codeword length $N=8$ with a 2-by-2 kernel, there are $2^8=256$ possibilities for estimated values $\hat{u}_0$ to $\hat{u}_7$. Other kernel sizes have different numbers of possibilities, such as $3^8$ for $N=8$ and a 3-by-3 kernel. As codeword length increases, the number of possibilities grows exponentially, and tracking of all decoding paths for all combinations of $\hat{u}_x$ becomes impractical. By tracking multiple decoding paths according to a list of size L, SCL decoders may still offer better decoding performance than SC decoders, with reasonable size and complexity. An SCL decoder monitors the best L decoding paths and estimates information bit values for the L decoding paths by combining Log Likelihood Ratio (LLR) values with previously computed partial sum values.

Each decoding path from the root (decoded bit #0) of a decoding tree is associated with a Path Metric (PM). A decoding path appends each newly decoded bit to previous estimated values. After the LLR computations for each decoded bit, path metrics are continuously updated using the LLR values as follows:

if the LLR value >=0

$PM[0,i+1]=PM[i]$ $PM[1,i+1]=PM[i]+|LLR|$ if the LLR value <0

$PM[0,i+1]=PM[i]+|LLR|$ $PM[1,i+1]=PM[i]$.

The best decoding paths have the smallest PM values. If an LLR is less than 0, then decoded bit is most likely a 1, so the next PM for the estimated value 1 (PM[1, i+1]) remains the same as the current path metric, and the absolute LLR value is added to the PM for the estimated value 0 (PM[0, i+1]), in effect "penalizing" the less likely path with the absolute LLR value. If the LLR value is near 0, then the decision for the value of $\hat{u}_x$ is unreliable and the PM penalty on the penalized path is small.

For every decoded bit in a decoding tree, each decoding path produces 2 new decoding paths. for a 2-by-2 kernel in the example shown. Each "leaf" decoding path inherits the LLR, partial sum, and PM values from its parent. After the number of decoding paths reaches L, an SCL decoder selects, based on the 2L PMs for the 2L candidate decoding paths, the L paths with the lowest PMs, and drops the other L decoding paths. The selected L paths are sorted using the PMs. For example, path sorting could assign path identifiers (IDs) or indices to the selected paths, with the path having the best PM being assigned a path ID #1, a path with the worst PM being assigned path ID #L, and other paths being assigned path IDs #2 to #(L−1) in accordance with their PMs. New decoding path Ds could be assigned after each sort step, following estimation of each codeword bit.

Figure 4:
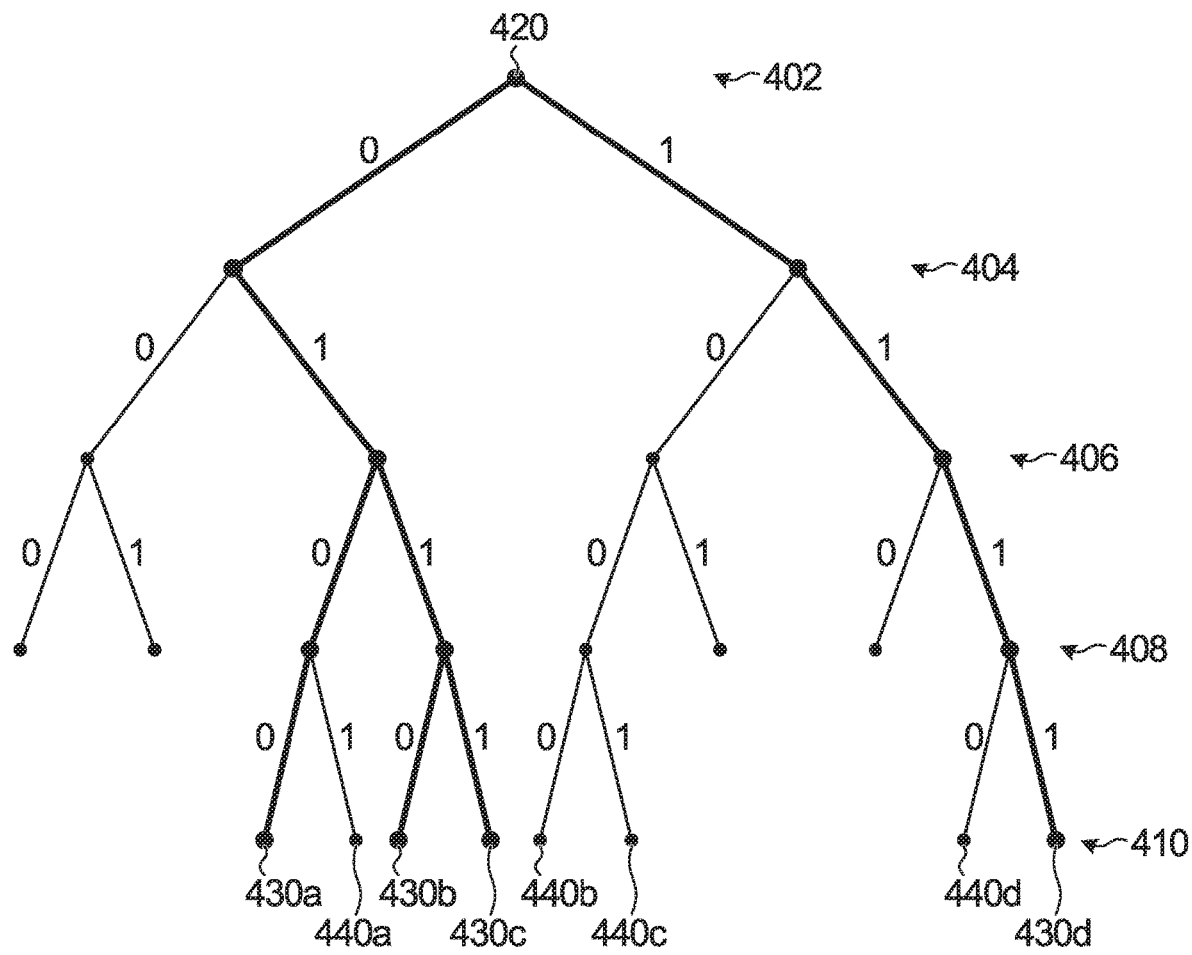
FIG. 4 is a diagram showing a portion of an example decision list tree whose width is limited by a maximum given list size and used in an SCL (Successive Cancellation List) polar decoder.

FIG. 4 is a diagram showing a portion of an example decision list tree used in an SCL polar decoder, whose width is limited by a maximum given list size L. In FIG. 4 the list size L is 4. Five levels 402, 404, 406, 408, 410 of the decision tree are illustrated. Although five levels are illustrated, it should be understood that a decision tree to decode K information bits (including CRC bits) would have K+1 levels. At each level after the root level 402, each one of up to 4 surviving decoding paths is extended by one bit. The leaf or child nodes of root node 420 represent possible choices for a first bit, and subsequent leaf nodes represent possible choices for subsequent bits. The decoding path from the root node 420 to leaf node 430a, for example, represents an estimated codeword bit sequence: 0, 1, 0, 0. At level 408, the number of possible paths is greater than L, so L paths having the highest likelihood (e.g. best PMs) are identified, and the remaining paths are discarded. The decoding paths that survive after the path sort at level 406 are shown in bold in FIG. 4. Similarly, at level 410, the number of possible paths is again greater than L, so the L paths having the highest likelihood (e.g. best PMs) are identified, and the remaining paths are again discarded. In the example shown, the paths terminating in leaf nodes 430a, 430b, 430c, and 430d represent the highest likelihood paths. The paths terminating in leaf nodes 440a, 440b, 440c, 440d are the lower likelihood paths which are discarded.

SCL decoding can be further divided into pure list decoding in which survivor paths with the highest likelihood are selected and CRC-Aided SCL (CA-SCL) decoding where CRC bits are used for path selection. SC decoding is a special case of pure list decoding, with list size L=1. A CRC may provide better error correction performance in the final path selection, but is optional in SCL decoding. Other decoding-assistant operations, such as a Parity Check (PC) based on parity or "PC" bits that are included in an input vector, could be used instead of or jointly with CRC bits in final path selection during decoding or in the final path selection.

SCL decoding largely improves the performance of a polar code for a limited code size. However, compared with the similar code length and code rates of Low Density Parity Check (LDPC) codes and Turbo codes, SCL decoding may have a worse Block Error Rate (BLER) than well-designed LDPC and Turbo codes. CA-SCL decoding may improve the performance of a polar code with a limited code length. For example, a CA-SCL decoder with a list size L=32 could provide for much better performance than LDPC and Turbo codes with similar computational complexity.

In an Additive White Gaussian Noise (AWGN) channel, a polar code in effect divides a channel into N sub-channels, where N is referred to as mother code length and is always is power of 2 in an Arikan polar code, which is based on a polar kernel that is a 2×2 matrix. A key to code construction for a polar code is to determine which bit-channels, also referred to herein as sub-channels, are selected or allocated for information bits and which sub-channels are allocated for frozen bits. In some embodiments, one or more sub-channels are also allocated to parity/PC, CRC, and/or other types of bits that are used to assist in decoding. In terms of polarization theory, the sub-channels that are allocated for frozen bits are called frozen sub-channels, the sub-channels that are allocated for information bits are called information sub-channels, and additional assistant sub-channels may be allocated to assistant bits that are used to assist in decoding. In some embodiments, assistant bits are considered to be a form of information bits, for which more reliable sub-channels are selected or allocated.

Figure 5:
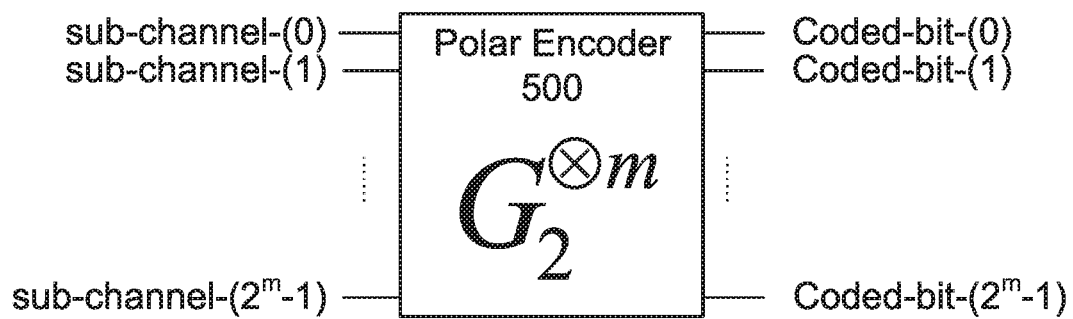
FIG. 5 is a block diagram illustrating an example of a polar encoder based on a 2-by-2 kernel.

Polar encoders based on Kronecker products of a 2-by-2 Arikan kernel $G_2$ are described above. FIG. 5 is a block diagram illustrating an example of a polar encoder 500 based on a 2-by-2 kernel. Sub-channels and coded bits are labeled in FIG. 5. As discussed in further detail herein, a channel is divided into N sub-channels by a polar code. An information block and frozen bits are allocated onto N sub-channels, and the resultant N-sized vector is multiplied with an N-by-N Kronecker matrix by the polar encoder 500 to generate a codeword that includes N coded bits. An information block includes at least information bits and could also include bits such as CRC bits or PC bits. A sub-channel selector (not shown) could be coupled to the polar encoder 500 to select sub-channels for information bits and any assistant bits, with any remaining sub-channels being frozen sub-channels.

For polar codes that are based on a 2-by-2 kernel and an N-by-N Kronecker matrix, N must be power of 2. This not only limits the performance boundary but also the granularity (code length and code rate) of a polar code. In fact, to have an arbitrary code rate or length for Arikan-based polar codes, some coded bits are punctured. BLER performance and coding stability could be decreased as a result.

Other forms of polarization kernels could yield polarization among code sub-channels. Examples of such different kernel forms and their usage are disclosed herein.

As a result of SC, SCL, or CA-SCL decoding, the polarization phenomenon appears over these synthesized sub-channels. Some synthesized channels have high capacity, and some have low capacity. Put another way, some synthesized sub-channels have equivalently high Signal-to-Noise Ratio (SNR) and others have equivalently low SNR. These metrics are examples of characteristics that could be used to quantify or classify sub-channel "reliability". Other metrics indicative of sub-channel reliability could also or instead be used.

Code construction involves determining a code rate (the number of information bits K, or how many sub-channels are to carry information bits) and selecting the particular K sub-channels among the N available sub-channels that are to carry information bits. For ease of reference herein, information bits could include input bits that are to be encoded, and possibly CRC bits, PC bits, and/or other assistant bits that are used to assist in decoding. Sub-channel selection is based on reliabilities of the sub-channels, and typically the highest reliability sub-channels are selected as information sub-channels for carrying information bits.

An initial step in code construction is to compute the reliabilities for all of the sub-channels, and then select the highest reliability sub-channels for the information bits and any CRC bits, parity/PC bits, or other "assistant" bits that are used to assist in decoding.

Sub-channel reliabilities could be specified, for example, in one or more ordered sequences. A single, nested, SNR-independent ordered sequence of sub-channels could be computed for a code length $N_{max}$, with ordered sequences for shorter code lengths N being selected from the longer $N_{max}$ sequence. Multiple ordered sequences in terms of different mother code lengths $N_i$ could instead be computed, and one of the mother code length sequences could be selected for a particular code based on preferred code length. Another possible option involves computing multiple ordered sequences in terms of SNR values, for example, and selecting an ordered sequence based on measured SNR.

There are several methods to compute sub-channel reliabilities, but these methods may lead to different results. For example, according to a genie-aided method proposed in R. Pedarsani, "Polar Codes: Construction and Performance Analysis", June 2011, EPFL master project, an encoder encodes a training sequence that is known to the decoder on different sub-channels. The decoder feeds back decoding results to the encoder so that the encoder can compute reliability statistics for every sub-channel, and a well-adapted reliability-vector over the sub-channels is obtained. The training procedure takes place with a given SNR, and therefore this method is SNR-related and not in real time.

As another example, Mori R, Tanaka T., "Performance and construction of polar codes on symmetric binary-input memoryless channels". IEEE International Symposium on Information Theory 2009, 1496-1500, proposes a density evolution (DE) method in which the reliability of a sub-channel is measured using the decoding error probabilities of Belief Propagation decoding, which can be calculated via density evolution. The proposed method is proven to be capacity-achieving for arbitrary symmetric binary erasure channels when used for polar construction. However, because the method relies on iterative calculations of LLR values for each sub-channel, it is computationally complex.

According to a genie-aided method proposed in E. Arikan, "Channel polarization: A method for constructing capacity-achieving codes for symmetric binary-input memoryless channels", IEEE Transactions on Information Theory, 2009, 55(7): 3051-3073, an encoder encodes on different sub-channels a training sequence that is known to the decoder. The decoder feeds back decoding results to the encoder so that the encoder can compute reliability statistics for every sub-channel, and a well-adapted reliability-vector over the sub-channels is obtained. The relative reliabilities for the sub-channels are dependent on the receiving SNR, making this method an SNR-dependent method.

Gaussian-approximation methods as proposed in J. Dai, K. Niu, Z. Si, "Evaluation and Optimization of Gaussian Approximation for Polar Codes", May 2016, and in P. Trifonov, "Efficient design and decoding of polar codes." IEEE Trans. on Communications 60.11 (2012): 3221-3227, assume that every coded bit is subjected to an equal error probability. From the error probability, the reliabilities over the sub-channels are obtained with a density evolution algorithm. Because this error probability on the coded bits is related to the receiving SNR, this method is also SNR-related and is computationally complex.

In mobile wireless communications, the radio channel is time-varying. It is impractical to consume significant communication bandwidth and processing resources for a genie-aided construction method. Gaussian-approximation may therefore be preferred, in conjunction with fixing a working SNR or reference SNR for a particular combination of code length and code rate.

However, Gaussian-approximation-based methods for computing reliabilities over the sub-channels are also highly complex. With shorter and shorter decoding latency requirements in some applications, it can be difficult to implement hardware for practical on-the-fly reliability computations. Storing all reliability vectors for all possible values of N and working SNRs would consume more memory than would be practical in a mobile wireless system, for example, and therefore in such an application it is necessary to re-compute sub-channel reliabilities whenever the mother code length N is changed.

Gaussian-approximation-based methods also require an SNR input. Different SNR inputs result in different reliability vectors. In order to align both an encoder and a decoder, a working SNR must be provided to both the encoder and the decoder. Also, any offset between a working SNR value that is used by the encoder and decoder and a real channel SNR at the decoder leads to performance loss.

An SNR-independent polarization weight (PW) method is disclosed in R1-1611254, "Details of the Polar Code Design", Huawei & HiSilicon, 3GPP TSG RAN WG1 Meeting #87. In this method, the reliability of a sub-channel is measured by the corresponding beta-expansion values, which are given by a closed-form formula as a function of the binary representation of the sub-channel index. The reliability measure is SNR-independent, and can lead to a single nested ordered sub-channel sequence for different coding rates and block lengths. The sequence may be calculated offline and stored in memory for use, to provide a lower implementation and computational complexity relative to other methods.

As mentioned above, there are several ways to generate an ordered sequence (from a kernel and its generator matrix) via calculating the sub-channel reliabilities. Not every way might necessarily lead to a nested sequence, and this nested sequence might not necessarily be unique. Nested ordered sequences could be generated, for example, based on a polarization weight as disclosed in Chinese Patent Application No. CN 201610619696.5, filed on Jul. 29, 2016, or based on a Hamming weight as disclosed in U.S. Patent Application No. 62/438,565, filed on Dec. 23, 2016, both of which are entirely incorporated herein by reference. Other techniques could also or instead be used.

Ordered sequence computations can be performed in a number of different ways. For example, the computations could be performed online, producing ordered sequences that can be dynamically adjusted or recomputed based on, for example, observed channel conditions. The computations may alternatively be performed offline (i.e. in advance) to produce pre-computed (and static) ordered sequences that can be stored and retrieved during subsequent coding operations. In yet another alternative, the computations may be performed partially online and partially offline.

As noted above, in mobile wireless communications, the channel conditions may significantly vary in time. It may be impractical to use online sequence computing methods with high computational complexity (e.g. genie-aided, DE and GA-based methods) because those methods may consume significant communication bandwidth and processing resources. Computationally complex methods, such as Genie-aided, DE and/or GA-based methods, are generally performed offline instead to produce multiple static ordered sequences, for example, by fixing a working SNR or reference SNR for different combinations of code length and code rate. However, simple online sequence generation methods such as those disclosed in U.S. Patent Application No. 62/463,128 entitled "APPARATUS AND METHODS OF SPECIFYING ORDERED SEQUENCES OF CODING SUB-CHANNELS" filed on Feb. 24, 2017 and incorporated herein by reference in its entirety may still be preferred, in that they generally consume less memory, and may be more flexible and adaptive to time-varying wireless channel conditions.

There may also be challenges associated with CRC-aided SCL decoding. For example, although CA-SCL may improve the performance of a polar code, one potential issue with such decoding relates to using CRC bits for error correction. In a mobile wireless system, for example, CRC bits may be attached to information bits and reserved for error detection only, to indicate to a decoder whether a current received coded block is decoded successfully. If a CRC were to be used for error correction in CA-SCL decoding for final path selection, CRC bits would be checked more than once. In the worst case, a CRC would be checked L times for a list size L. This could significantly increase a false-alarm rate that should be carefully limited in a mobile wireless system, especially for physical control channels. For example, if random bits are transmitted to a UE, the UE may pass its CRC bits and report the decoded bits to higher layers. If coded bits are transmitted to a UE, then the UE could actually decode some bits incorrectly, but the CRC could still pass. Especially in wireless systems, for example, it may be preferable to avoid such false alarms or limit them to a very low probability. CRC was proposed mostly for this purpose. Every time that CRC bits are checked, there is some loss of detection capability. It may therefore be desirable for a polar code to be constructed to allow the decoder to avoid using CRC bits for error correction and maintain good BLER performance.

Returning to encoding, a Kronecker matrix (generator matrix) is a low-triangle matrix, which means that the first sub-channel is distributed on all of the coded bits and the last sub-channel is distributed only on the last bit. This implies that the reliability of the last sub-channel is higher than that of the first sub-channel. This is quite different from other channel coding schemes, in which an encoder equally "distributes" all information bits into a codeword. In this sense, the performance of a polar code could be more sensitive to puncturing than other types of channel coding schemes. In comparison, because every coded bit in a convolutional code or an LDPC code is related to all information bits, even after some coded bits are punctured a convolutional or LDPC decoder can still recover all information bits from the coded bits that remain after puncturing. When designing a puncturing scheme for polar code, this puncturing sensitivity characteristic and the relevance between punctured bits and sub-channels should be carefully considered.

Figure 6:
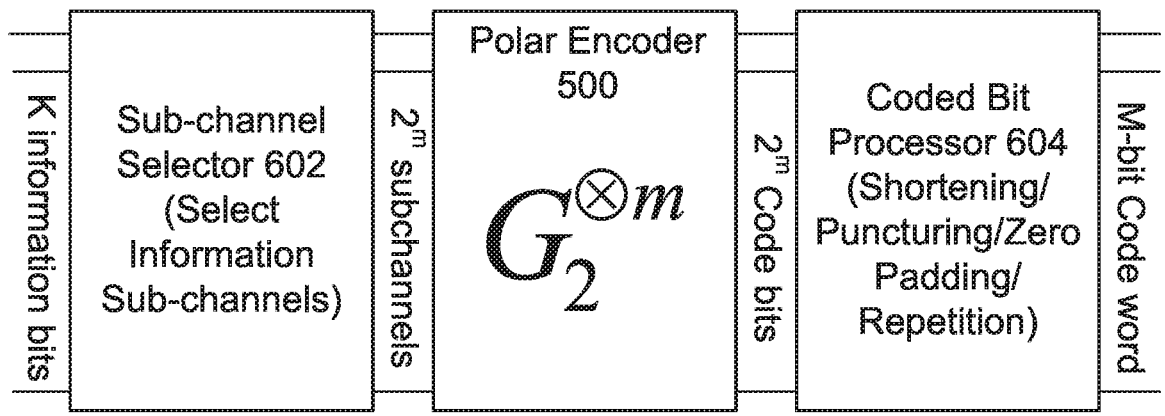
FIG. 6 is a block diagram illustrating an example of a rate-matching polar encoder based on 2-by-2 kernel, which includes a sub-channel selector, a polar encoder (FIG. 5) and coded-bit processor.

As noted above, puncturing could be used to provide for different code rates and code lengths for Arikan kernel-based polar codes. FIG. 6 is a block diagram illustrating an example of a rate-matching polar encoder, which includes a sub-channel selector 602, a polar encoder 500 (FIG. 5) and a coded-bit processor 604. The example in FIG. 6 is based on a 2-by-2 kernel, K information bits, an M-bit codeword, and an R=K/M code rate that is achieved by puncturing by the coded bit processor 604. The coded bit processor 604 may also or instead perform other coded bit processing, such as shortening, zero padding, and/or repetition.

Each of the above aspects of code construction, including kernel design, reliabilities and selection of sub-channels for code construction, non-CRC-aided error correction, and code shortening and puncturing, is discussed in further detail herein.

Regarding kernel design, the kernel proposed by Arikan is a 2-by-2 binary kernel, which implies that 2 input bits are encoded together, and each sub-channel is used to encode or carry a respective single bit. The 2-by-2 binary kernel is proven to have the highest exponent value (0.5) in a binary kernel (1 sub-channel for 1 bit). This exponent value is an indicator of the degree of polarization. A higher degree of polarization means that there are more reliable sub-channels that have higher capacity than for a code with a lower degree of polarization. However, the Arikan 2-by-2 kernel produces a Kronecker matrix (generator matrix) whose dimension must be a power of 2. Some coded bits may need to be punctured to match a target code rate and/or code length, impacting performance.

Figure 7:
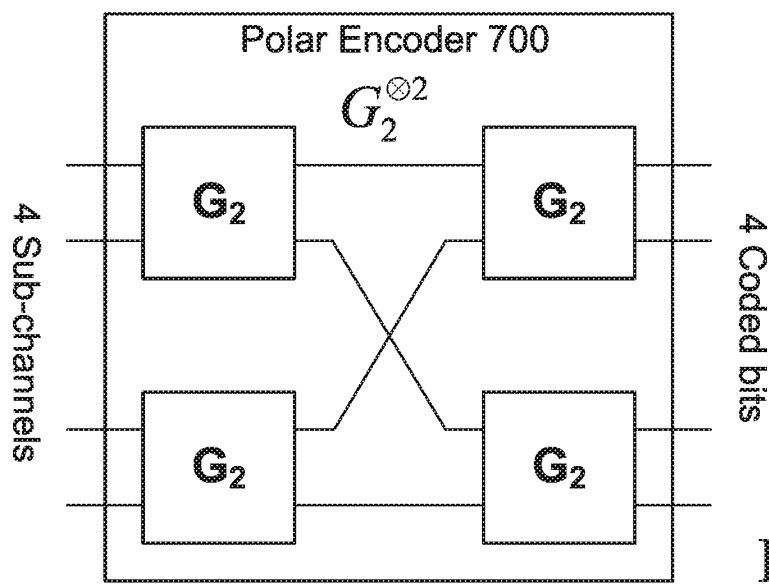
FIG. 7 is a block diagram illustrating an example of a nested polar encoder based on a 2-by-2 kernel.

Examples of $G_2$-based polar coding generator matrices are shown in FIG. 1. FIG. 7 is a block diagram illustrating an example of a nested polar encoder 700 based on a 2-by-2 kernel. The $G_2$ blocks shown in FIG. 7 could be implemented, for example, by matrix multipliers, and are also referred to herein as kernel encoders. A nested encoder is based on a generator matrix in which smaller dimension kernels are used to produce a larger dimension kernel. For example, the four 2-by-2 kernel encoders (and the corresponding 2-by-2 matrices) in FIG. 7 are "nested" as shown to yield the 4-by-4 polar encoder 700. The 4-by-4 kernel is the generator matrix for a 4-entry input block.

There are also other types or forms of kernels, including kernels with different primary-numbered dimensions. Such kernels may be used in polar coding if their form complies with polarization theory, that is, polarization is maintained at the decoding side. For example, a binary kernel could be 3-by-3, 5-by-5, 7-by-7, and so on. Unlike a 2-by-2 kernel, which has a single unique format, other prime-numbered kernels may have different formats and still maintain polarization at the decoding side.

Figure 8:
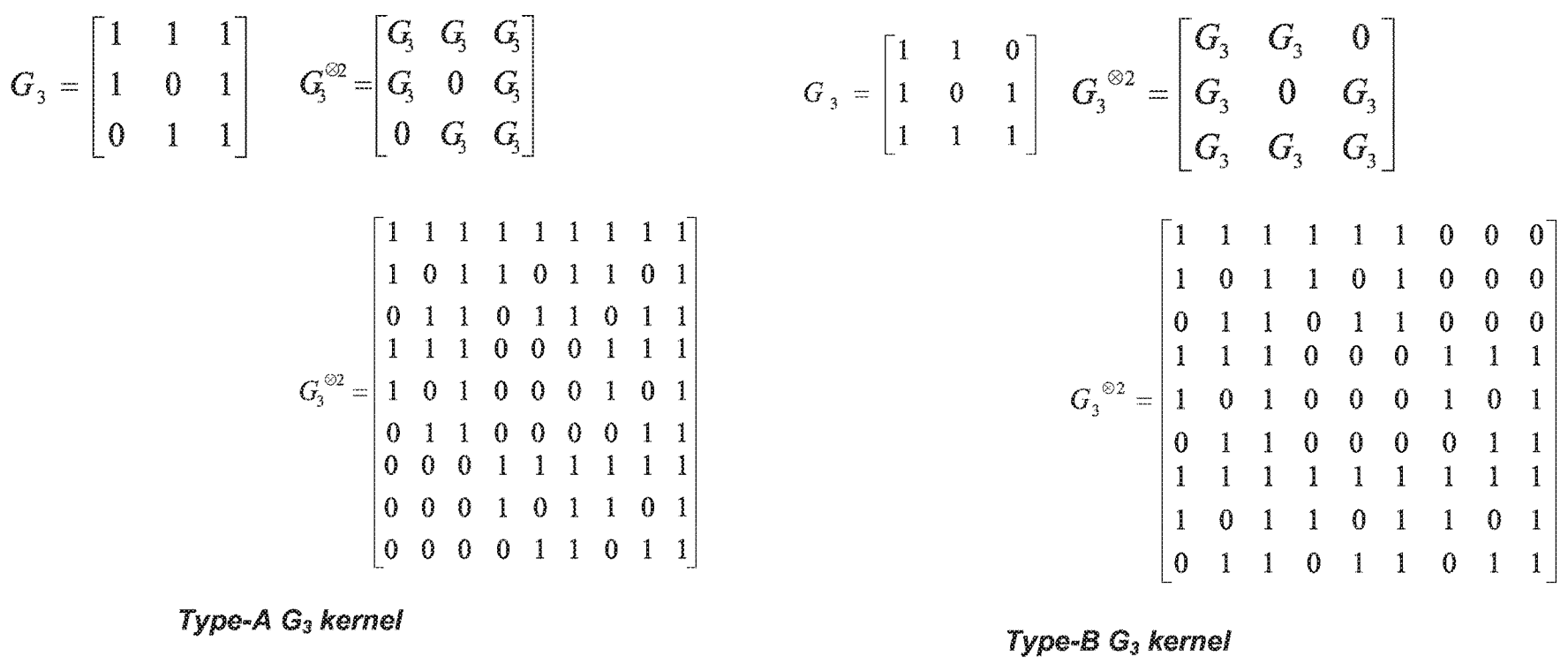

FIG. 8 is a diagram showing how polar coding generator matrices can be produced from 3-by-3 kernels. Type A and Type B $G_3$ kernels are shown by way of example, and generator matrices of order higher than 3 can be produced as Kronecker products of each $G_3$ matrix.

Two or more prime-numbered kernels could be combined to form higher dimension kernels. As shown in FIG. 7, for example, a combination of two 2-by-2 $G_2$ kernels can form a 4-by-4 $G_4$ kernel. In another example, a combination of 2-by-2 $G_2$ kernels and 3-by-3 $G_3$ kernels can form a 6-by-6 $G_6$ kernel. FIG. 9 includes block diagrams illustrating two example higher dimension encoders 902, 904 based on different types of lower dimension kernel encoders, including $G_2$ and $G_3$ kernel encoders. $G_6$ kernels and encoders could instead be formed using multiple stages of $G_3$ kernels and encoders. There are various ways in which lower dimension kernels could be combined (or interconnected) to produce higher dimension kernels. FIG. 9 is just one example. Also, higher dimension kernels could themselves be combined to produce an even higher dimension kernel. For example, four $G_6$ kernels could be combined to produce a $G_{12}$ kernel, etc. This principle works for higher dimension kernels that are themselves directly or indirectly composed of prime number kernels.

Some embodiments are described herein in the context of kernel encoders. It should be appreciated, however, that kernels or matrices themselves could be combined. For example, an encoding approach such as shown by way of example in FIGS. 7 and 9 could be expressed as a product of matrices, which are themselves constructed based on prime number dimension matrices. Such encoding could be denoted in the form d=u $G_A*G_B$, where $G_A$ is a matrix that is made up of prime number dimension $G_Y$ matrices and $G_B$ is a matrix that is made up of prime number dimension $G_Z$ matrices. As an example, for the polar encoder 902 in FIG. 9 and the matrix expression above, $G_A$ is based on a combination of $G_3$ kernels or matrices, and $G_B$ is based on a combination of $G_2$ kernels or matrices.

A $G_6$ kernel or matrix is an example of a higher dimension kernel or matrix that is based on a combination of lower dimension kernel or matrices. In the case of the polar encoders in FIG. 9, the example $G_6$ kernels or matrices, of dimension 6, are both based on a combination $G_2$ and $G_3$ prime number dimension kernels or matrices. Even higher dimension kernels or matrices could be constructed based on $G_6$ kernels or matrices, and/or kernels or matrices of higher dimension than 6, but even in such embodiments the higher dimension matrices could be decomposed into, and in at least this sense can be considered to be based on, prime number dimension kernels or matrices.

Although the above-noted exponent value, or another indicator of degree of polarization, of any non-two prime number dimension kernel is smaller than that of the Arikan 2-by-2 kernel, a non-two prime number dimension kernel or a combination of different dimensions of kernels can generate a non-power-of-two generator matrix. A lower degree of polarization may result in poorer performance compared to Arikan kernel-based coding. However, a non-power-of-two generator matrix might involve no puncturing, or fewer punctured bits, for code rate and/or code length matching, with no or less impact to the non-power-of-two code performance.

If one sub-channel can transmit more than one bit, then several bits can be combined into a symbol in a defined alphabet, and a non-binary symbol is transmitted encoded each sub-channel. Accordingly, polarization kernels are not limited to binary kernels. Symbol-level (Galois field) or non-binary kernels are also contemplated. For example, a 4-by-4 symbol-based kernel is described below. Similar to a binary kernel, a non-binary kernel could have different dimensions, including prime numbered dimensions.

The following example is a non-binary kernel that is called an RS-4 kernel. We first define the following symbol mapping on Galois-4 field:
(0,0)↔0
(0,1)↔α
(1,1)↔α²
(1,0)↔α³ (or 1)
The kernel is $$G_{RS-4} = \begin{bmatrix} 1 & 1 & 1 & 0 \\ \alpha & \alpha^2 & 1 & 0 \\ \alpha^2 & \alpha & 1 & 0 \\ 1 & 1 & 1 & \alpha \end{bmatrix}$$

Multiplication and addition operations on the Galois-4 field are as follows:
Multiplication $$0 \cdot x = 0$$

$$1 \cdot x = x$$

$$\alpha^m \cdot \alpha^n = \alpha^{(m+n) \bmod 3}$$

Addition $$\alpha^3 + \alpha^2 = (1,0) + (1,1) = (0,1) = \alpha$$

This is just an example. Other Galois field definitions and non-binary kernels are possible.

It should also be noted that a 2-by-2 binary kernel can be regarded as a special case, in Galois-2 field.

A non-binary kernel could be preferred for its larger exponent value and higher polarization degree than a binary kernel. However, decoding computation complexity is higher for a non-binary kernel, because a decoder would handle symbols rather than bits.

Non-binary kernels possess characteristics of binary kernels. Furthermore, non-binary kernels could be combined or cascaded with binary kernels to form one polar code. Although the Arikan 2-by-2 binary kernel is used herein as an example, disclosed features may be extended to other types of polarization kernels.

Turning now to sub-channel reliabilities and selection or allocation, in a mobile wireless system for example, both information block length ($K_{max}$) and code length ($M_{max}$) are limited or capped. The maximum code length results in a maximum mother code length $N_{max}$ for polar code. In the case of an Arikan 2-by-2 kernel, for example, $N_{max}$ is a power of 2, $2^x$. In the case of a 3-by-3 kernel, $N_{max}$ is power of 3, $3^x$. In the case of 10-by-10 kernel, $N_{max}$ is power of 10, $10^x$. In the case of a dual 2-bit symbol non-binary 3-by-3 kernel with 2 symbols of 4 bits total length, $N_{max}$ is $4*3^x$. $N_{max}$ can be similarly determined for other types and/or dimensions of kernels.

Once a kernel is selected (for example, 2-by-2, 3-by-3, 6-by-6, binary or Galois), the selected kernel can be used to build a generator matrix by a Kronecker product that is "nested", which allows a nested ordered sequence of sub-channels to be found. Herein, $Q_{max}$ based on an Arikan 2-by-2 kernel is disclosed as an illustrative example of a nested ordered sequence.

As noted above, there are several ways to generate such a nested ordered sequence from a kernel and its generator matrix. Not every way might necessarily lead to a nested sequence, and this nested sequence might not necessarily be unique. Examples of generating nested ordered sequences, based on a polarization weight, are referenced above. Other techniques could also or instead be used.

Relative reliabilities between sub-channels and the order of reliabilities, in particular which sub-channels have higher reliability than others, is more important to code construction than absolute reliabilities. In this context, an ordered sequence or a vector ($Q_{max}$) in terms of the reliabilities over the $N_{max}$ sub-channels could be provided, in ascending or descending order. Each entry in such an ordered sequence is an index of a sub-channel in one embodiment. The size of this sequence ($Q_{max}$) is ($K_{max}$). For example, for $N_{max}=16$ and $K_{max}=16$, the ordered sequence of sub-channels indices, sorted in ascending order of polarization reliability among the 16 sub-channels, could be $Q_{max}=[0\ 1\ 2\ 4\ 8\ 3\ 5\ 6\ 9\ 10\ 12\ 7\ 11\ 13\ 14\ 15]$. Sub-channel #15 has the highest polarization reliability and sub-channel #0 has the lowest reliability in this example. In some embodiments, only the $K_{max}$ strongest or most reliable $Q_{max}$ sequence entries, and not all $N_{max}$ entries, are stored.

Different polarization reliability metrics can be generated by different methods, to arrive at a sorted sequence of sub-channels. Storage and/or organization of such a sequence could be adapted for space optimization (compressed) or for easy access from memory, for example.

The sequence ($Q_{max}$) has a nested property. For an Arikan 2-by-2 kernel, for example, if $K_{max}'=K_{max}/2$, $M_{max}'=M_{max}/2$, and $N_{max}'=N_{max}/2$, then the sequence ($Q_{max}'$) is a subset of ($Q_{max}$). This nested property means that for any combination ($K \leq K_{max}$, $M \leq M_{max}$, and $N \leq N_{max}$), the sequence Q can be built by consecutively selecting sub-channels whose indices are less than N from the longest $Q_{max}$ in memory. For example, for $N_{max}'=8$, $Q_{max}'=[0\ 1\ 2\ 4\ 3\ 5\ 6\ 7]$ for the above example of $Q_{max}$. In this example, $Q_{max}'$ (for $N_{max}'=8$) is obtained by trimming of $N_{max}'=8$ from $Q_{max}$ (for $N_{max}=16$).

A nested sequence is not SNR-dependent. The Genie-assisted and Gaussian Approximation methods noted above need an SNR input, so that different SNRs lead to different sequences, which could be a significant issue for wireless time varying channels for example. A nested sequence, however, does not change based on SNR. Sub-channel reliabilities in a nested sequence stay the same irrespective of SNR. This could be useful, for example, to enable a nested sequence to be standardized. The most reliable sub-channels can then be selected from the same nested sequence regardless of actual SNR.

A prime-number kernel itself is not nested. The way to build a generator matrix or a larger kernel, a Kronecker product as disclosed herein, is nested to provide for polarization. Such nested building of a generator matrix also provides for a nested ordered sequence of sub-channel polarization reliabilities. For example, a simple hamming weight method could be used. There are several methods to derive a nested sequence from a nested generator matrix, without being dependent on SNR. When generating an ordered sequence, SNR is not used as an input value for generation of an SNR-independent sequence. In both Genie-assisted and Gaussian Approximation methods, SNR is one of the input values.

Genie-assisted and Gaussian Approximation methods are also dependent on code rate as well. Different code rates have different sequences. 5G New Radio (NR), for example, may use fine granularity of code rate, which would involve high computation load and/or a very large memory table for storing sub-channel sequences for a fine level of code rate granularity.

A nested sequence could also simplify implementation, in that only one sequence for $N_{max}$ could be stored. For any N less than $N_{max}$, an ordered sequence Q can be determined by simply selecting the most reliable sub-channels that have indices less than N from $Q_{max}$, or equivalently by trimming the sub-channel indices that are greater than or equal to N from $Q_{max}$.

In some implementations, a single sequence could be stored at both an encoder and a decoder to avoid ambiguity between the encoder and the decoder. In SNR-dependent methods, it is nearly impossible to ensure that the encoder and the decoder have exactly the same SNR value and therefore the same ordered sequence. An SNR-driven sequence is believed to have an optimal performance with a particular working SNR, which ideally exactly matches the real SNR at the decoder. Once there is an offset, the optimal performance is lost. In a wireless system, and it is very difficult to entirely avoid any offset between the working SNR and actual SNR.

As can be seen, a kernel designed in accordance with the principles described above may allow an ordered sequence of sub-channels (e.g. $Q_{max}$) to be found which is nested and/or SNR-independent, suitable for polar coding.

In some embodiments (with or without a kernel designed as described herein) in order to avoid CRC-aided error correction at a decoder, some sub-channels may be used to transmit bits that decoders will use to assist in decoding. Such assistant bits could be used to assist in path selection during decoding, for example. Selection of a correct decoding path could in effect correct errors in a received word, and in this sense path selection could be considered as embodying a form of error correction.

Assistant bits are neither information bits (CRC bits are treated as information bits in an embodiment herein) nor frozen bits, but may be generated from information bits by a rule that is known to both an encoder and a decoder. These bits could be considered error detection bits, error correction bits, or path selection bits, for example, but are referred to herein primarily as assistant or decoding-assistant bits. Examples of assistant bits include extra CRC bits, parity check (PC) bits, and checksum bits.

For illustrative purposes, assistant bits are described below as being allocated to sub-channels that are separate from sub-channels used for information and frozen bits. Assistant bits could provide for an extra CRC reserved for CA-SCL decoding apart from normal CRC bits appended to a code block. This is an example of one special case of the present disclosure of assistant bits and assistant sub-channels, which in one embodiment are selected after all of the information sub-channels have been selected. In another embodiment, the assistant sub-channels are selected from the frozen sub-channel space, from sub-channels that normally would be used for frozen bits for example.

The assistant sub-channels that transmit decoding-assistant bits could be scattered over the entire sub-channel space, which could be preferred for better performance, or occupy at least some consecutive sub-channel positions. The number (X) of these assistant sub-channels could be more than one, and up to (N-K). This maximum number (N-K) varies with code length and code rate, and X could be controlled for a simpler decoding complexity. In an embodiment, the first assistant sub-channels appear after several information sub-channels, because an SC-based decoder processes the information bits first, and then decodes assistant bits to select the path over the previously processed information bits.

Therefore, a code constructor could divide the entire sub-channel space including all sub-channels into three groups, including information sub-channels for K information bits, decoding-assistant sub-channels for X decoding-assistant-assistant bits, and frozen sub-channels for (N-K-X) frozen bits.

Figure 10:
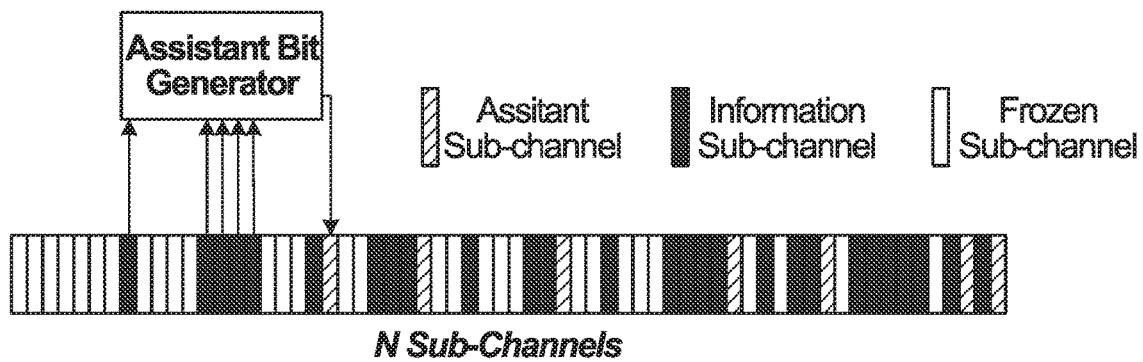
FIG. 10 is a block diagram illustrating an example of assistant bit generation and assistant sub-channel allocation.

FIG. 10 is a block diagram illustrating an example of assistant bit generation and assistant sub-channel allocation. According to a rule that is known or otherwise distributed to an encoder and a decoder, an assistant bit is generated based on a number of information bits that are allocated to information sub-channels, and the assistant bit is allocated to an assistant sub-channel after the information sub-channels that encode those information bits. Multiple assistant bits could be generated and assigned to assistant sub-channels, as shown in FIG. 10. Distributed assistant sub-channels are shown in FIG. 10 by way of example. Assistant sub-channels could also or instead include multiple consecutive sub-channels.

Figure 11:
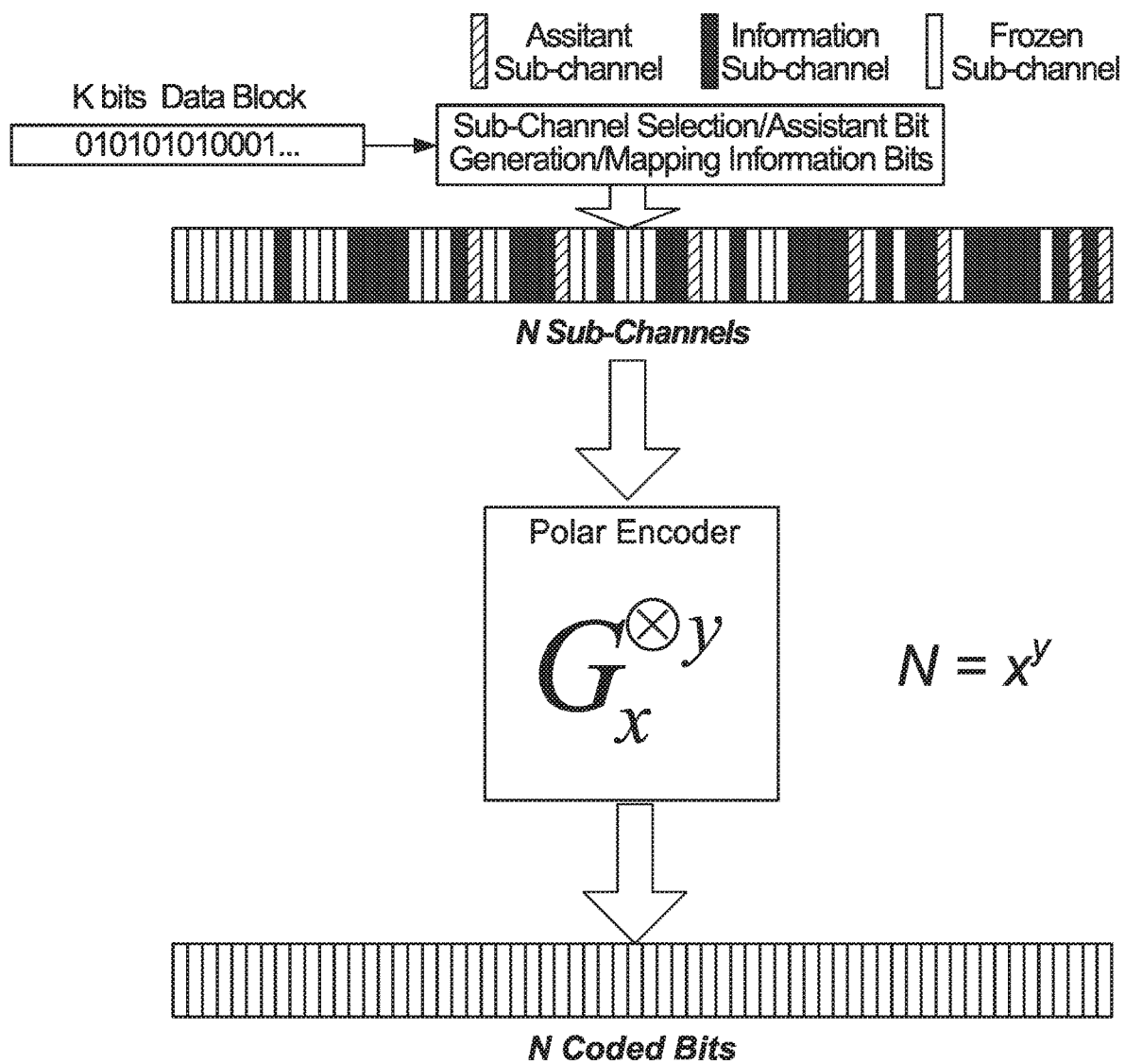
FIG. 11 is a block diagram illustrating an example of information, assistant, and frozen sub-channel encoding.

FIG. 11 is a block diagram illustrating an example of information, assistant, and frozen sub-channel encoding. Based on at least some bits of a K-bit data block, assistant bits are generated, and information bits (including data bits and possibly CRC, parity, and/or other bits generated therefrom), frozen bits, and the assistant bits are respectively allocated or mapped to information sub-channels, frozen sub-channels, and assistant sub-channels. For example, in some embodiments the assistant bits represent a checksum (for error detection) over some part of the information bits.

In an embodiment, one or more checksums are added as assistant bits to assist a decoder to determine or select the paths of a list decoding procedure. A checksum is a small-sized datum (checksum bits) from some or all bits of an input information block for the purpose of error detection. The procedure that yields a checksum is called checksum function. For example, parity-check bits are a kind of checksum and parity-check function is a checksum function that yields parity-check bits. CRC bits are a type of parity-check bits and a CRC encoder is a type of parity-check function.

Whether such checksum bits, or other types of assistant bits, are used and how they are used could be decoding implementation-dependent. For example, if current channel conditions are very good (high SNR), then a decoder could determine that checksum bits need not be used to assist in decoding a current CB (code block), or a decoder could use checksum bits to terminate a decoding process early if it detects a decoding failure based on the checksum bits.

A checksum need not be used only to determine whether an entire CB is correctly decoded. For example, a single CB could contain more than one checksum. If more than one checksum is taken in one CB, these checksums could be yielded by different checksum functions or one checksum function, and from different portions or the same portion of an information block.

Unlike the CRC bits appended to each CB (code block), these checksum bits could be transparent to higher layer but known only to a channel encoder and decoder. The number of checksum bits could be either fixed or variable. For example, this number could be dependent on code length and/or code rate. Checksum bits could take either consecutive sub-channels or non-consecutive sub-channels.

Figure 11A:
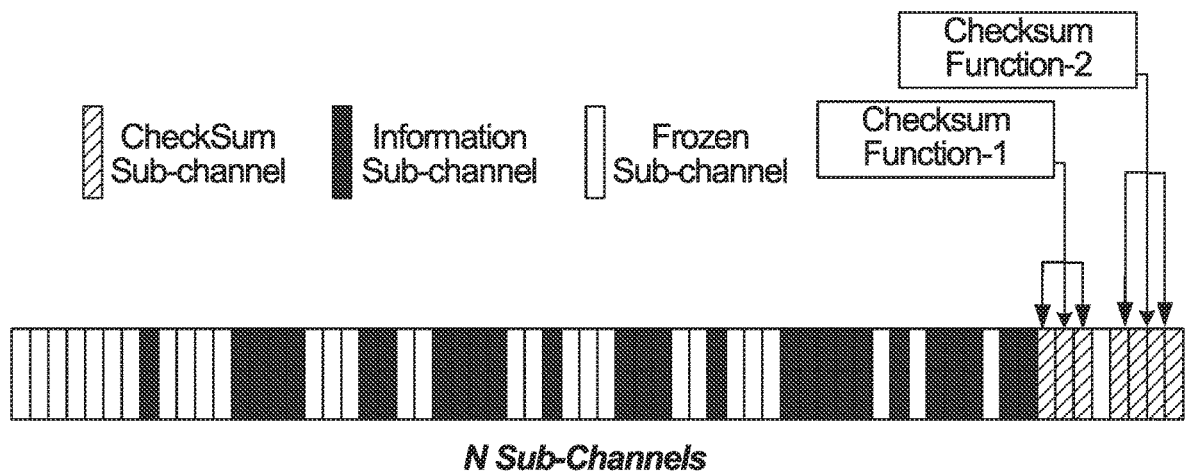
FIG. 11A is a block diagram illustrating checksum sub-channels as an example of assistant channels, carrying checksums generated by different checksum functions.
Figure 11B:
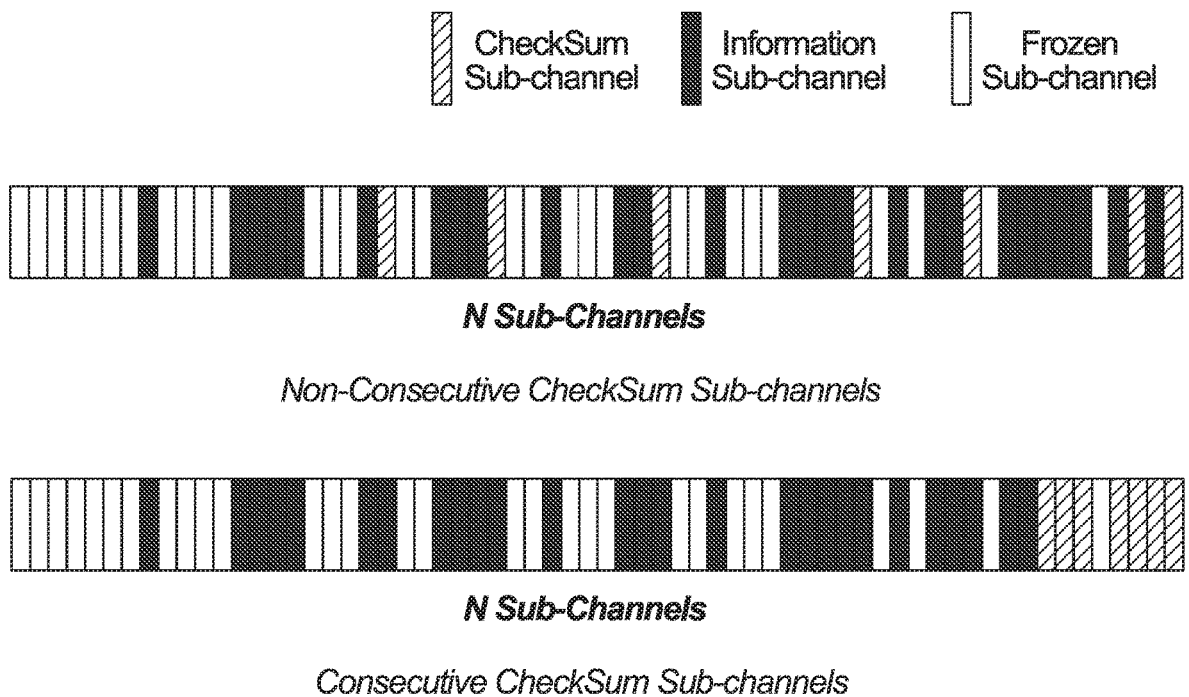
FIG. 11B is a block diagram illustrating non-consecutive and consecutive checksum sub-channels.

FIG. 11A is a block diagram illustrating checksum sub-channels (as an example of assistant channels) carrying checksums generated by different checksum functions, and FIG. 11B is a block diagram illustrating non-consecutive and consecutive checksum sub-channels.

The selection of information sub-channels could be based on a polarization reliability (Q sequence), for example, whereas the selection of the decoding-assistant (for example, checksum) sub-channels could be based on more than a polarization reliability (Q sequence) metric (e.g. based also on a second metric) in order to enable the positions of these decoding-assistant sub-channels to be distributed more randomly or more efficiently among the information sub-channels, for example.

In some embodiments, two different metrics are used for decoding-assistant sub-channel selection. For example, a first metric can be a polarization reliability metric (e.g. Q sequence) and a second metric can be a weight such as a hamming weight of the sub-channels (or a function of the hamming weight). A hamming weight could be preferred partly because it is used by Reed-Muller (RM) code and partly because of its simplicity. RM code can be regarded as a special example of polar codes, in that it is based on hamming weight rather than polarization reliability, and it uses a Maximum-Likelihood (ML) decoding algorithm (hamming-weight-based RM code approaches the ML performance boundary if code length is small) but it can be decoded with SC or SCL decoding.

For example, the ordered sequence $Q_{max}$ in terms of polarization reliability for $N_{max}=16$ in the example above is $Q_{max}$=[0 1 2 4 8 3 5 6 9 10 12 7 11 13 14 15], and their hamming weights are [0 1 1 1 1 2 2 2 2 2 2 3 3 3 4]. Polarization reliability basically matches the hamming weights but provides finer granularity. With increasing N, these two metrics would become more different from each other.

Hamming weight of a sub-channel is defined herein to be the Hamming weight of a row of a generator matrix. See FIG. 12, which is a block diagram illustrating Hamming weights of and row weights of sub-channels of a 4-by-4 polar code generator matrix. In a polar code, the Hamming weight of a sub-channel is related to the row weight of this sub-channel in its generator matrix (row-weight=2^(hamming weight)). Row weight indicates the number of the coded bits a sub-channel is distributed on. Generally speaking, the more coded bits an information bit input to a sub-channel is distributed on, the more robust that sub-channel is. For the example of a 4-by-4 generator matrix shown in FIG. 12, sub-channel #0 has a Hamming weight of 0 and it is distributed onto the code bit #0 only. Sub-channel #3 has a Hamming weight of 2 and it is distributed onto four code bits.

In other words, a bit on sub-channel #3 has a better chance of being decoded correctly than a bit on sub-channel #0. Or, all the four sub-channels are distributed on the coded bit #0 so that there is much more interference on coded bit #0 than coded bit #3. From this point of view, it may be more likely to allocate an information bit to sub-channel #3 and sub-channel #0, or puncturing a coded bit associated with sub-channel #0 does less harm than puncturing a coded bit associated with sub-channel #3.

Intuitively, the more coded bits onto which an information bit is distributed, the more robust that information bit is; and hence the higher reliability.

An example of how the hamming weight can be used as the second metric to select assistant sub-channels is discussed in more detail in U.S. Provisional application No. 62/433,127 filed on Dec. 12, 2016 which is incorporated by reference herein. Note that the hamming weight is just an example of a metric that could be used as a second metric. Other examples include a function of the hamming weight (e.g. row weights as disclosed in U.S. Provisional application No. 62/432,448 filed on Dec. 9, 2016 and incorporated by reference herein. Generally, any other metric also indicative of the (polarization) reliability can be used as the second metric. In a further alternative, the second metric is different from the first metric but also relate to or is indicative of the polarization reliability. However, in yet another alternative, the natural order of sub-channels can be used as the second metric so that, for instance, sub-channels at the end of the information sub-channels are selected as the assistant sub-channels.

In some embodiments, more than two metrics could be used for selecting assistant sub-channels. In addition, any of various assistant sub-channel selection algorithms using the above described metrics could be used. Other possibilities exist for selecting assistant sub-channels.

Figure 13:
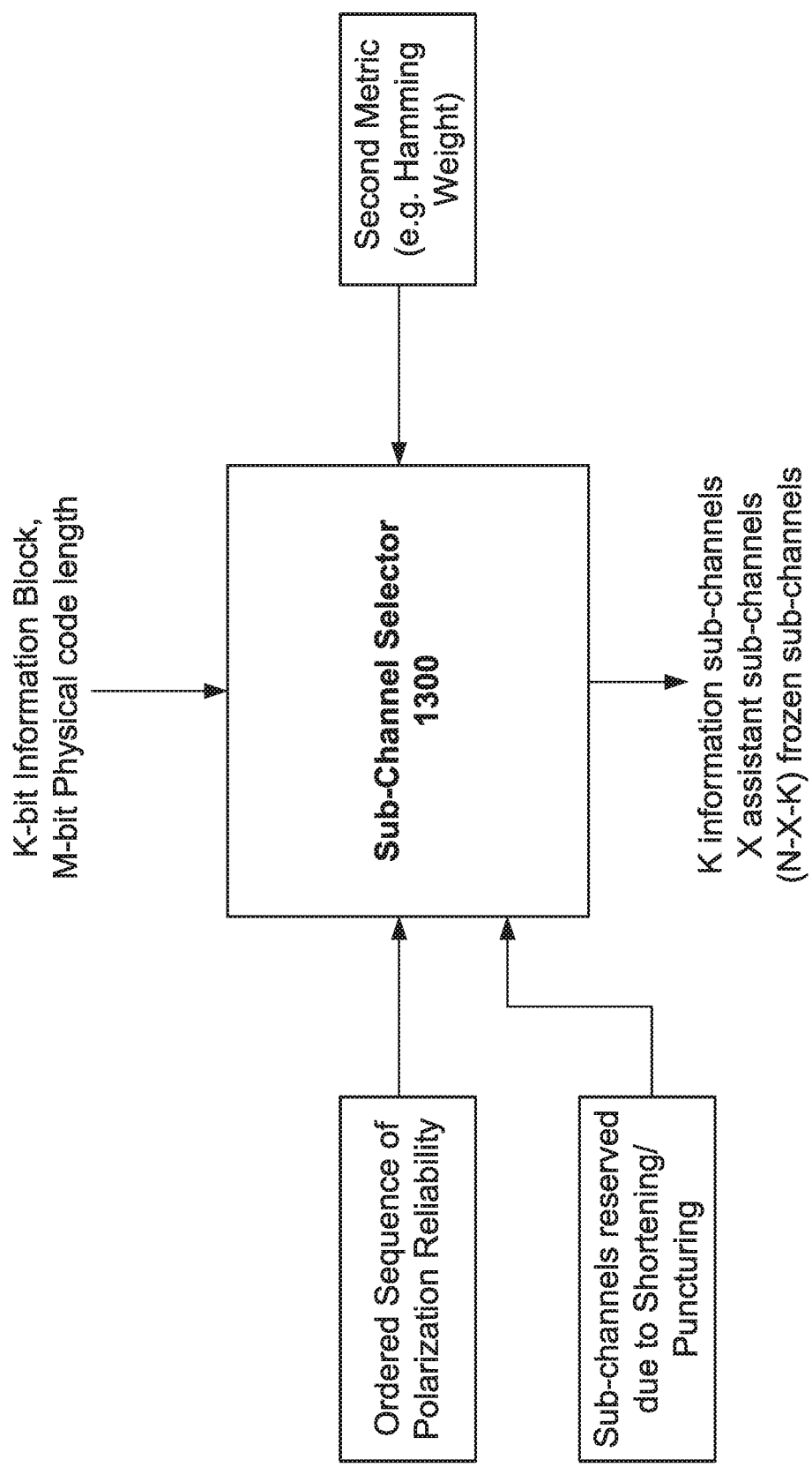
FIG. 13 is a block diagram of an example sub-channel selector.

FIG. 13 is a block diagram of an example sub-channel selector. In FIG. 13, the sub-channel selector 1300 may select information, assistant, and frozen sub-channels based on polarization reliability, and a second metric shown by way of example as a hamming weight. Other parameters could also be taken into account, such as reservations of sub-channels due to shortening or puncturing, as shown.

Figure 14:
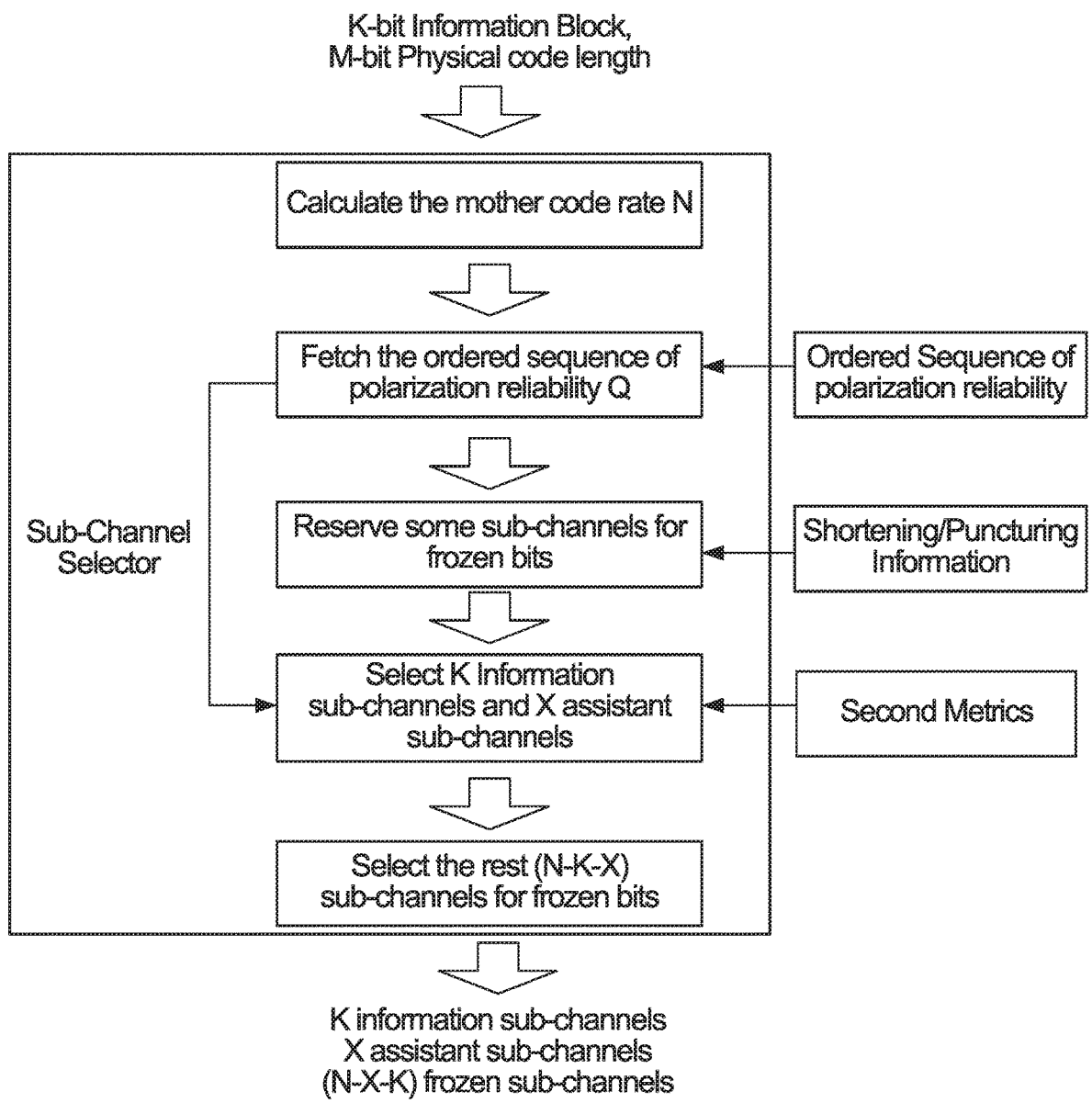
FIG. 14 is a flow diagram illustrating a method of sub-channel selection.

FIG. 14 is a flow diagram illustrating a method of sub-channel selection. The order of the selections of the information and decoding-assistant sub-channels could be: select the information sub-channels first and the decoding-assistant sub-channels secondly; select the decoding-assistant sub-channels first and the information sub-channels secondly; pre-select decoding-assistant sub-channel candidates, select the information sub-channels secondly, and then determine the decoding-assistant sub-channels; select both information and assistant sub-channel candidates in parallel and then switch some sub-channels between two sets.

The method shown by way of example in FIG. 14 is intended solely for illustrative purposes. There may be various methods to select the information sub-channels and the assistant sub-channels. Selection order could be as noted above, or a different order, and performance could be different depending on the order in which the sub-channels are selected, and/or the criteria used for sub-channel selection.

Regarding puncturing, in an extreme example the bit on the first sub-channel is distributed on only the first coded bit, because the generator matrix (Kronecker) is a low-triangle matrix. If this first coded bit was punctured out and the first sub-channel transmitted an information bit, then this bit would not be recoverable at a decoder. In contrast, since the bit on the last sub-channel is distributed on all the coded bits, it could be recovered even if several coded bits are punctured out. With an ordered sequence such as a $Q_{max}$ sequence, the first sub-channel is rarely selected for information bits or for decoding-assistant bits, and the last sub-channel tends to be selected for information bits. If some systematic bits are transmitted with the coded bits, then these systematic bits ought to be kept after any code shortening and puncturing stage.

These examples indicate that there can be a strong relationship between punctured bits and sub-channel selection. In an embodiment, a shortening/puncturing pattern is first determined, and then sub-channels that should be avoided for both information bits and decoding-assistant bits can be identified. The mapping from a shortening/puncturing pattern could be realized by, for example, bit reverse mapping. A coding scheme could mix more than one mapping scheme.

Figure 15:
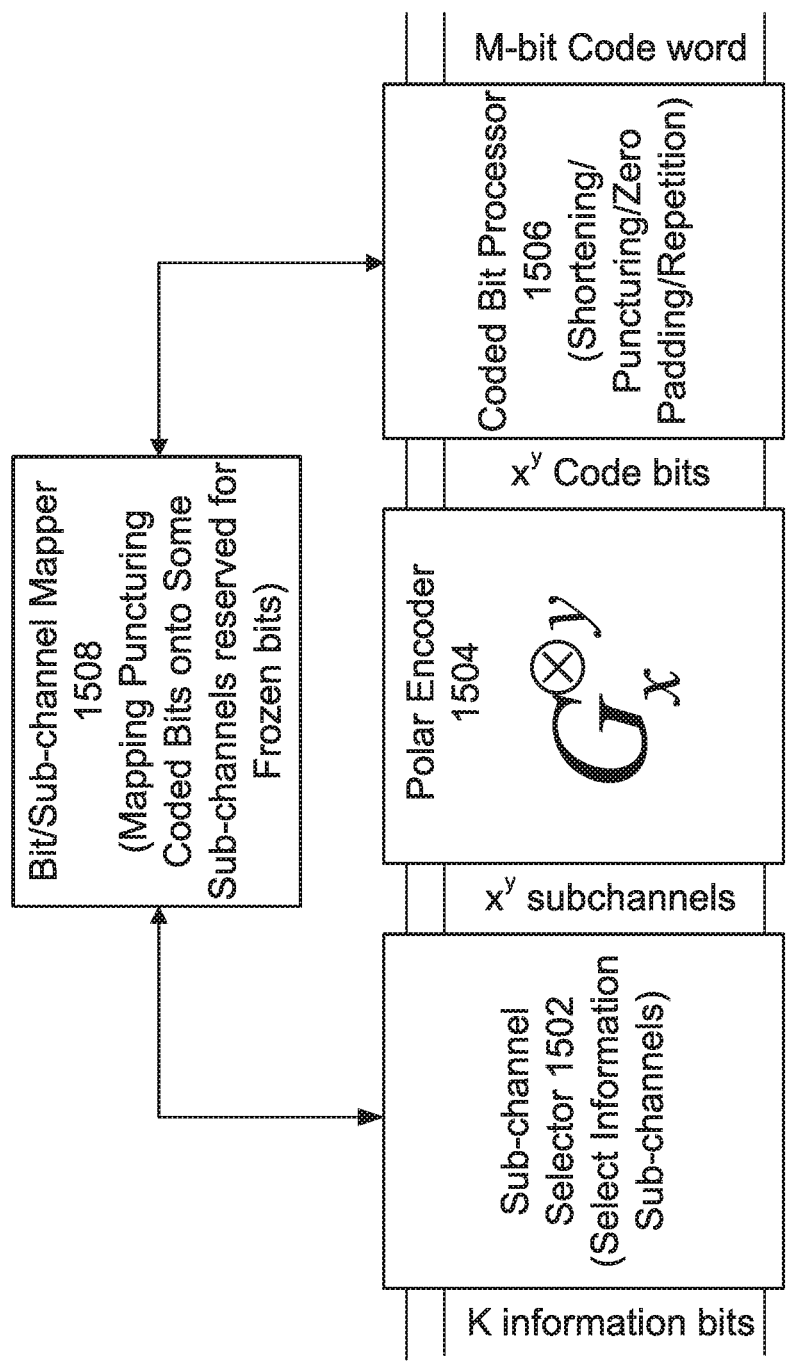
FIG. 15 is a block diagram illustrating an example of encoding that takes puncturing into consideration in sub-channel selection.

FIG. 15 is a block diagram illustrating an example of encoding that takes puncturing into consideration in sub-channel selection. Coded bits that are output by the polar encoder 1504 are punctured by the coded bit processor 1506 to generate an M-bit codeword in the example shown. A puncturing pattern is mapped to sub-channels by the bit/sub-channel mapper 1508, and the sub-channels that are to be punctured according to the puncturing pattern are avoided for allocation by the sub-channel selector 1502 to information bits and assistant bits. Those sub-channels could also equivalently be considered to be reserved for frozen bits. Any of various methods could be used to shorten and puncture a codeword, and similarly any of various methods could be used to map punctured coded bits to sub-channels. In another embodiment, sub-channel allocation or selection by the sub-channel selector 1502 is performed first, and bit/sub-channel mapping is fed forward to the coded bit processor 1506 to avoid puncturing coded bits corresponding to sub-channels to which information bits or assistant bits, for example, are allocated.

Puncturing is an example of an operation that could be performed on coded bits by a coded bit processor such as 1506 to generate a codeword. Other examples shown in FIG. 15 include shortening, zero padding, and repetition of coded bits. These operations could similarly be mapped by the bit/sub-channel mapper 1508 to sub-channels that could be taken into consideration, and possibly avoided, for selection as information sub-channels or assistant sub-channels by the sub-channel selector 1502.

Figure 16:
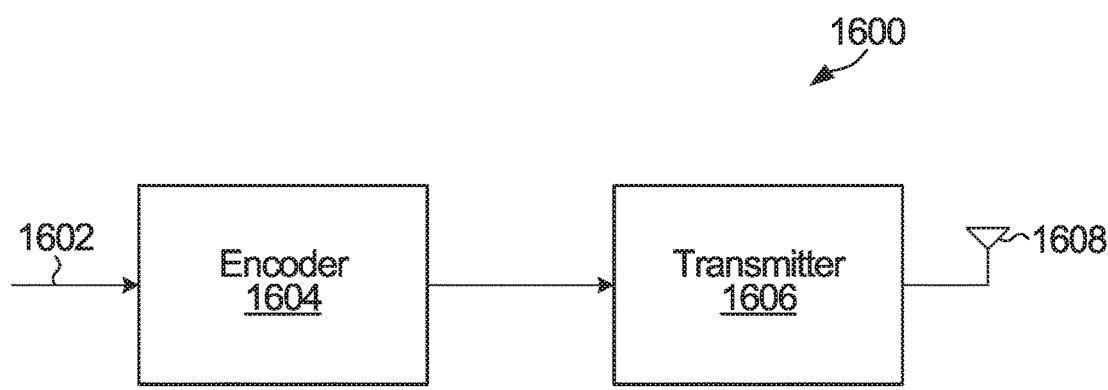
FIG. 16 is a block diagram of an example apparatus for encoding and transmitting codewords.

FIG. 16 is a block diagram of an apparatus for encoding and transmitting codewords. The apparatus 1600 includes an encoder 1604 coupled to a transmitter 1606. The encoder 1604 is implemented in circuitry that is configured to encode an input bit stream 1602 as disclosed herein. In the illustrated embodiment, the apparatus 1600 also includes an antenna 1608, coupled to the transmitter 1606, for transmitting signals over a wireless channel. In some embodiments, the transmitter 1606 includes a modulator, an amplifier, and/or other components of a Radio Frequency (RF) transmit chain.

The encoder 1604 is implemented in circuitry, such as a processor, that is configured to encode input bits as disclosed herein. In a processor-based implementation of the encoder 1604, processor-executable instructions to configure a processor to perform encoding operations are stored in a non-transitory processor-readable medium. The non-transitory medium could include one or more solid-state memory devices and/or memory devices with movable and possibly removable storage media. More generally, the encoder 1604 may be implemented in hardware or circuitry (e.g. in one or more chipsets, microprocessors, application-specific integrated circuits (ASICs), field-programmable gate arrays (FPGAs), dedicated logic circuitry, or combinations thereof) so as to produce codewords as described herein for transmission by a separate (RF) unit.

The encoder 1604 is configured to encode input bits into codewords that include coded bits. In an embodiment, the encoder 1604 includes multiple encoding stages. The multiple encoding stages include a first stage of kernel encoders to apply a polar encoding kernel matrix $G_Y$ of prime number dimension Y to the input bits, and a second stage of kernel encoders coupled to receive an output bit from each of the kernel encoders in the first stage and to apply a polar encoding kernel matrix $G_Z$ of prime number dimension Z to the output bits received from the kernel encoders in the first stage. FIGS. 7 and 9 show examples of such kernel encoders. The transmitter 1606 is coupled to the encoder 1604, to transmit the codewords.

Multiple-stage encoding with sequential stages of kernel encoders represents one illustrative embodiment. Encoding could also or instead be considered a form of applying encoding matrices. For example, the encoder 1604 could be configured to apply a first plurality of polar encoding matrices $G_Y$ of prime number dimension Y to input bits to produce output bits, and to apply a second plurality of polar encoding matrices $G_Z$ of prime number dimension Z to the output bits to produce a codeword with coded bits.

The encoder 1604 could implement any of various other features that are disclosed herein. For example, any one or more of the following could be provided, alone or in any of various combinations, in embodiments:

Y=Z;

Y is different from Z;

at least one of Y and Z is greater than two;

at least one of $G_Y$ and $G_Z$ is non-binary and is applied to multi-bit symbols;

$G_Y$ and $G_Z$ define sub-channels, and the encoder 1604 further comprises (or is coupled to) a sub-channel selector to select, based on an ordered sequence of the sub-channels such as a nested and SNR independent ordered sequence of the sub-channels, sub-channels to code information bits in the input bits;

the sub-channel selector is configured to select K sub-channels, in an order of increasing or decreasing reliability for example, from an ordered sequence of the sub-channels, which includes N max sub-channels in an embodiment;

$G_Y$ and $G_Z$ define sub-channels, and the encoder 1604 further comprises (or is coupled to) a sub-channel selector to select, based on a sub-channel polarization reliability metric and at least one additional second metric, particular ones of the sub-channels to code particular bits in the input bits, such as sub-channels to code assistant bits in the input bits;

the at least one second metric comprises any one or more of: a hamming weight, a row weight, and a natural order of the sub-channels;

the particular bits are assistant bits to assist in decoding;

the assistant bits are for error detection path selection in a decoder;

the assistant bits comprise one or more of: parity check, checksum, and CRC bits;

the particular ones of the sub-channels are consecutive sub-channels or sub-channels scattered in a sub-channel space;

the sub-channel selector is further configured to select, based on the sub-channel polarization reliability metric, either or both of most reliable sub-channels to code information bits in the input bits, and least reliable sub-channels to code frozen bits;

$G_Y$ and $G_Z$ define sub-channels, and the encoder further comprises (or is coupled to) a sub-channel selector to select, based on sub-channels affected by operations that are to be performed on coded bits, particular ones of the sub-channels to code particular bits in the input bits;

$G_Y$ and $G_Z$ define sub-channels, and the encoder further comprises (or is coupled to) a sub-channel selector to select particular ones of the sub-channels to code particular bits in the input bits and a coded bit processor to select, based on the selected sub-channels, coded bits for further processing operations;

the encoder is further configured to apply a third plurality of polar encoding matrices of third prime number dimension, and to apply a fourth plurality of polar encoding matrices of fourth prime number dimension—in a combination of four Type-A or Type-B $G_6$ kernels (FIG. 9) to produce a $G_{12}$ kernel, for example, in total there would be four pluralities of prime number dimension ($G_2$ and $G_3$) kernels;

the encoder is configured to apply a higher dimension matrix that is based on a combination of the first plurality of polar encoding matrices $G_Y$ and the second plurality of polar encoding matrices $G_Z$ and that has a dimension higher than Y and Z—the Type-A and Type-B $G_6$ kernels in FIG. 9 are examples of such a higher dimension matrix, based on a combination of dimension 2 and dimension 3 matrices, that has a dimension 6, which is greater than 2 or 3;

the encoder is further configured to apply a further higher dimension matrix that is based on a combination of a third plurality of polar encoding matrices of a third prime number dimension and a fourth plurality of polar encoding matrices of a fourth prime number dimension, the further higher dimension matrix having a dimension greater than the third prime number and the fourth prime number—again, a combination of four Type-A or Type-B $G_6$ kernels (FIG. 9) to produce a $G_{12}$ kernel is an effective example, in which the higher dimension kernel could be a Type-A or Type-B $G_6$ kernel, and the further higher dimension kernel could also be a Type-A or Type-B $G_6$ kernel.

In some alternative embodiments, the functionality of the encoder 1604 and transmitter 1606 described herein may be fully or partially implemented in software or modules, for example in encoding and transmitting modules stored in a memory and executed by a processor(s) of the apparatus 1600.

Figure 17:
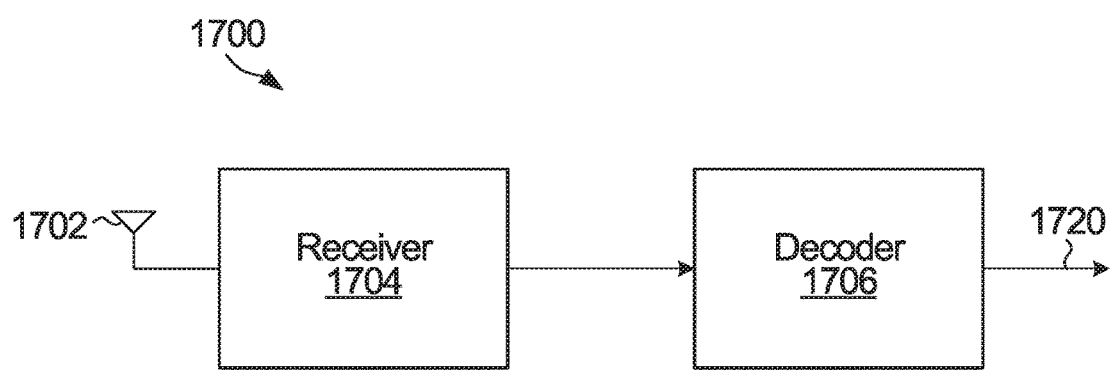
FIG. 17 is a block diagram of an example apparatus for receiving and decoding codewords.

FIG. 17 is a block diagram of an example apparatus for receiving and decoding codewords. The apparatus 1700 includes a receiver 1704 coupled to an antenna 1702 for receiving signals from a wireless channel, and a decoder 1706. In some embodiments, the receiver 1704 includes a demodulator, an amplifier, and/or other components of an RF receive chain. The receiver 1704 receives, via the antenna 1702, a word that is based on a codeword of a polar code. Decoded bits are output at 1720 for further receiver processing.

In some embodiments, the apparatus 1700, and similarly the apparatus 1600 in FIG. 16 as noted above, include a non-transitory computer readable medium that includes instructions for execution by a processor to implement and/or control operation of the encoder 1604 in FIG. 16, to implement and/or control operation of the decoder 1706 in FIG. 17, and/or to otherwise control the execution of methods described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a compact disc read-only memory (CD-ROM), universal serial bus (USB) flash disk, or a removable hard disk.

The decoder 1706 is configured to decode received codewords. Assistant bits could be used by the decoder 1706 to assist in decoding.

In some alternative embodiments, the functionality of the receiver 1704 and decoder 1706 described herein may be fully or partially implemented in software or modules, for example in receiving and decoding modules stored in a memory and executed by a processor(s) of the apparatus 1700. In some embodiments, the decoder 1706 may be implemented in hardware or circuitry (e.g. in one or more chipsets, microprocessors, ASICs, FPGAs, dedicated logic circuitry, or combinations thereof) so as to decode codewords that are received by a separate (RF) unit.

Communication equipment could include the apparatus 1600, the apparatus 1700, or both a transmitter and a receiver and both an encoder and a decoder. Such communication equipment could be user equipment or communication network equipment.

Figure 18:
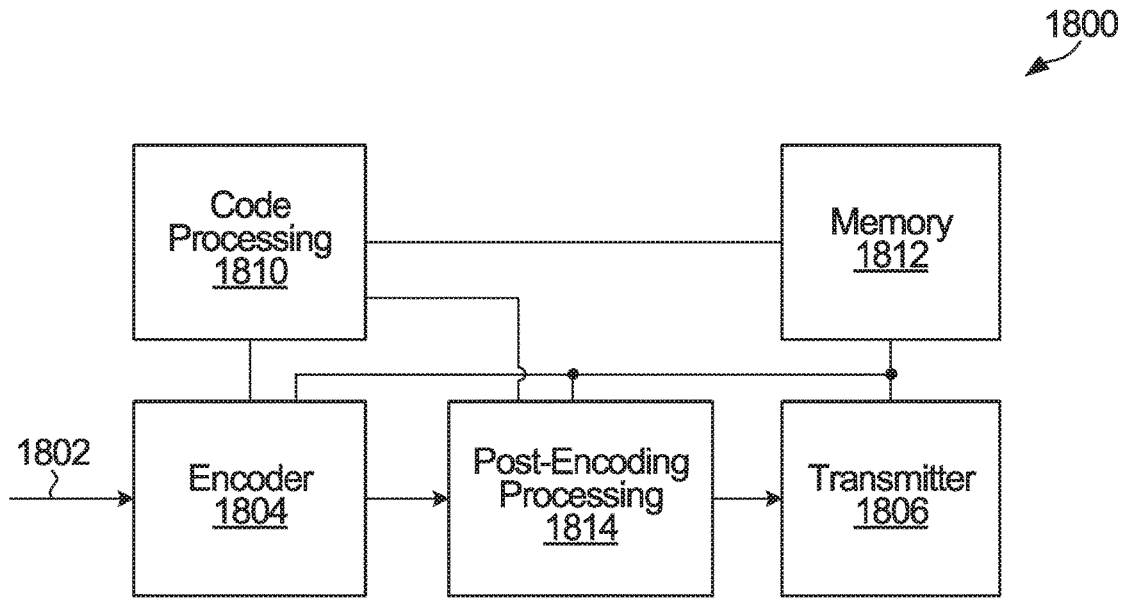
FIG. 18 is a block diagram of another example apparatus for encoding and transmitting codewords.

FIG. 18 is a block diagram of another example apparatus for encoding and transmitting codewords. The apparatus 1800 includes an encoder module 1804 coupled to a transmitter module 1806. The apparatus 1800 also includes a code processing module 1810 coupled to the encoder module 1804 and a post-encoding processing module 1814. The post-encoding processing module 1814 is also coupled to the encoder module 1804 and to the transmitter module 1806. A memory 1812, also shown in FIG. 18, is coupled to the encoder module 1804, to the code processing module 1810, to the post-encoding processing module 1814, and to the transmitter module 1806. Although not shown, the transmitter module 1806 could include a modulator, an amplifier, antenna and/or other modules or components of a transmit chain or alternatively could be configured to interface with a separate (RF) transmission module. For example, some of all of the modules 1804, 1806, 1810, 1812, 1814 of the apparatus 1800 may be implemented in hardware or circuitry (e.g. in one or more chipsets, microprocessors, ASICs, FPGAs, dedicated logic circuitry, or combinations thereof) so as to produce codewords as described herein for transmission by a separate (RF) unit.

In some embodiments, the memory 1812 is a non-transitory computer readable medium at 1812, that includes instructions for execution by a processor to implement and/or control operation of the code processing module 1810, the encoder module 1804, the post-encoding processing module 1814, the transmitter module 1806 in FIG. 18, and/or to otherwise control the execution of functionality and/or embodiments described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a CD-ROM, USB flash disk, or a removable hard disk, at 1812.

In some embodiments, the encoder module 1804 is implemented in circuitry, such as a processor, that is configured to encode input bits as disclosed herein. In a processor-based implementation of the encoder module 1804, processor-executable instructions to configure a processor to perform encoding operations are stored in a non-transitory processor-readable medium. The non-transitory medium could include, in the memory 1812 for example, one or more solid-state memory devices and/or memory devices with movable and possibly removable storage media.

The code processing module 1810 could be implemented in circuitry that is configured to determine coding parameters such as mother code block length, and to determine an ordered sub-channel sequence as disclosed herein. In some embodiments, the code processing module 1810 is implemented using a processor. The same processor or other circuitry, or separate processors or circuitry, could be used to implement both the encoder module 1804 and the code processing module 1810. As noted above for the encoder module 1804, in a processor-based implementation of the code processing module 1810, processor-executable instructions to configure a processor to perform code processing operations are stored in a non-transitory processor-readable medium, in the memory 1812 for example.

Like the encoder module 1804 and the code processing module 1810, the post-encoding processing module 1814 is implemented in circuitry, such as a processor, that is configured to perform various post-encoding operations. These post-encoding operations could include rate-matching operations such as puncturing, shortening and/or interleaving, for example. In a processor-based implementation of the post-encoding processing module 1814, processor-executable instructions to configure a processor to perform post-encoding operations are stored in a non-transitory processor-readable medium, examples of which are described above. In an embodiment, the post-encoding processing module 1814 derives a puncturing or shortening scheme from a puncturing or shortening scheme that is to be applied to a codeword prior to transmission. Information indicative of bit positions and/or sub-channels that are affected by post-encoding operations, or information from which such bit positions or sub-channels may be determined, may be fed back to the code processing module 1810, stored to the memory 1812, or otherwise made available to the code processing module 1810 by the post-encoding processing module 1814.

In some embodiments of the code processing module 1810, the coding parameters and/or the ordered sub-channel sequence may be determined based on information from the post-encoding processing module 1814. For instance, the ordered sub-channel sequence may be determined based on the rate-matching scheme determined by the post-encoding processing module 1814. Conversely, in some other embodiments, the post-encoding processing module 1814 may determine a rate-matching scheme based on the coding parameters and/or the ordered sub-channel sequence determined by the code processing module 1810. In yet some other embodiments, the determinations made within the code processing module 1810 and post-encoding processing module 1814 are jointly performed and optimized.

The apparatus 1800 could implement any of various other features that are disclosed herein. For example, the encoder module 1804, the transmitter module 1806, the code processing module 1810, and/or the post-encoding processing module 1814 could be configured to implement any one or more of the features listed or otherwise described above with reference to FIG. 16.

In some alternative embodiments, the functionality of the encoder module 1804, the transmitter module 1806, the code processing module 1810, and/or the post-encoding processing module 1814 described herein may be fully or partially implemented in hardware or alternatively in software, for example in modules stored in a memory such as 1812 and executed by one or more processors of the apparatus 1800.

An apparatus could therefore include a processor, and a memory such as 1812, coupled to the processor, storing instructions which, when executed by the processor, cause the processor to perform the functionality and/or embodiments described above in relation to the encoder module 1804, the transmitter module 1806, the code processing module 1810, and/or the post-encoding module 1814 described herein.

Figure 19:
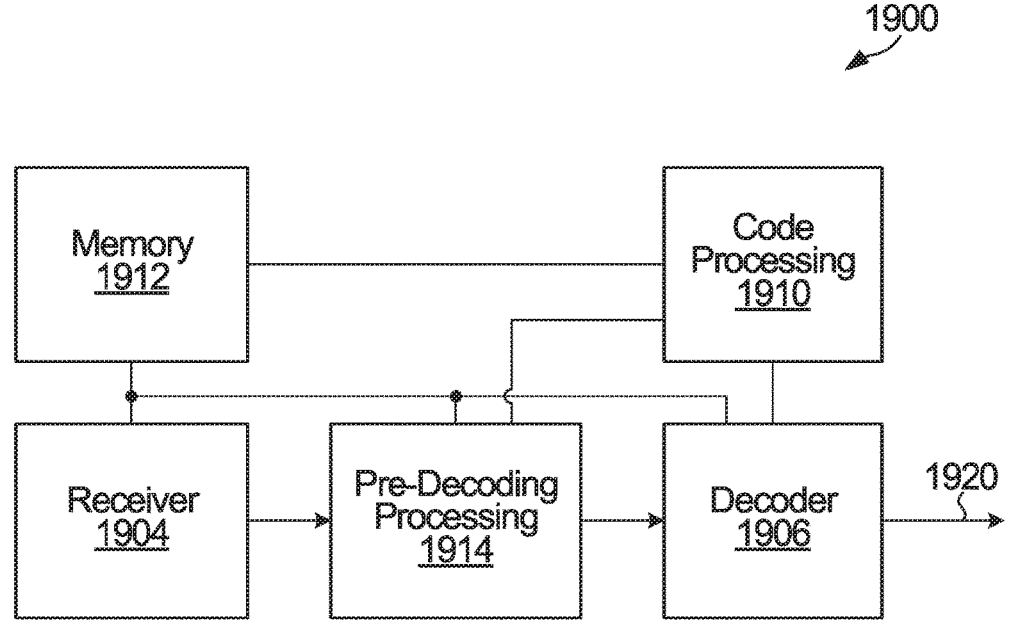
FIG. 19 is a block diagram of another example apparatus for receiving and decoding codewords.

FIG. 19 is a block diagram of an example apparatus for receiving and decoding codewords. The apparatus 1900 includes a receiver module 1904 which is configured to receive signals transmitted wirelessly and which is coupled to a decoder module 1906. The apparatus 1900 also includes a code processing module 1910 coupled to the decoder module 1906 and a pre-decoding processing module 1914. The pre-decoding processing module 1914 is also coupled to the decoder module 1906 and to the receiver module 1904. A memory 1912 also shown in FIG. 19, is coupled to the decoder module 1906, to the code processing module 1910, to the receiver module 1904, and to the pre-decoding processing module 1914.

Although not shown, the receiver module 1904 could include an antenna, demodulator, amplifier, and/or other modules or components of a receive chain or alternatively could be configured to interface with a separate (RF) receiving module. For example, some of all of the modules 1904, 1906, 1910, 1912, 1914 of the apparatus 1900 may be implemented in hardware or circuitry (e.g. in one or more chipsets, microprocessors, ASICs, FPGAs, dedicated logic circuitry, or combinations thereof) so as to receive a word based on a codeword of a polar code as described herein. Decoded bits are output at 1920 for further receiver processing.

In some embodiments, the memory 1912 is a non-transitory computer readable medium that includes instructions for execution by a processor to implement and/or control operation of the receiver module 1904, decoder module 1906, the code processing module 1910, and the pre-decoding processing module 1914 in FIG. 19, and/or to otherwise control the execution of functionality and/or embodiments described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a CD-ROM, USB flash disk, or a removable hard disk, at 1912.

The decoder module 1906 is implemented in circuitry, such as a processor, that is configured to decode received codewords as disclosed herein. In a processor-based implementation of the decoder module 1906, processor-executable instructions to configure a processor to perform decoding operations are stored in a non-transitory processor-readable medium. The non-transitory medium could include, in the memory 1912 for example, one or more solid-state memory devices and/or memory devices with movable and possibly removable storage media.

The code processing module 1910 is implemented in circuitry that is configured to determine (and store to the memory 1912) ordered sub-channel sequences as disclosed herein. In a processor-based implementation of the code-processing module 1910, processor-executable instructions to configure a processor to perform code-processing operations are stored in a non-transitory processor-readable medium, examples of which are described above. Information representing ordered sub-channel sequences, and/or the selected sub-channels could be provided to the decoder module 1906 by the code processing module 1910 for use in decoding received words, and/or stored in the memory 1912 by the code processing module 1910 for subsequent use by the decoder module 1906.

Like the decoder module 1906 and the code processing module 1910, the pre-decoding processing module 1914 is implemented in circuitry, such as a processor, that is configured to perform pre-decoding operations. These operations could include receiver/decoder-side rate matching operations also known as de-rate-matching operations, such as de-puncturing and/or de-shortening to reverse puncturing/shortening that was applied at an encoder/transmitter side, for example. In a processor-based implementation of the pre-decoding processing module 1914, processor-executable instructions to configure a processor to perform pre-decoding processing operations are stored in a non-transitory processor-readable medium, examples of which are described above. In an embodiment, the pre-decoding processing module 1914 derives a puncturing or shortening scheme from a puncturing or shortening scheme that is to be applied to a received codeword. Information indicative of bit positions and/or sub-channels that are affected by pre-decoding processing, or information from which such bit positions or sub-channels may be determined, may be fed back to the code processing module 1910, stored to the memory 1912, or otherwise made available to the code processing module 1910 by the pre-decoding processing module 1914.

In some embodiments of the code processing module 1910, the ordered sub-channel sequence may be determined based on information from the pre-decoding processing module 1914. For instance, the ordered sub-channel sequence may be determined based on the rate-matching scheme determined by the pre-decoding processing module 1914. Conversely, in some other embodiments, the pre-decoding processing module 1914 may determine a rate-matching scheme based on the coding parameters and/or the ordered sub-channel sequence determined by the code processing module 1910. In yet some other embodiments, the determinations made within the code processing module 1910 and pre-decoding processing module 1914 are jointly performed and optimized.

In some alternative embodiments, the functionality of the receiver module 1904, the decoder module 1906, the code processing module 1910, and/or the pre-decoding processing module 1914 described herein may be fully or partially implemented in software or modules, for example in receiving and decoding modules stored in a memory 1912 and executed by one or more processors of the apparatus 1900.

An apparatus could therefore include a processor, and a memory such as 1912, coupled to the processor, storing instructions which, when executed by the processor, cause the processor to perform the functionality and/or embodiments disclosed herein, or receiving/decoding operations corresponding to transmitting/encoding operations disclosed herein.

The apparatus 1900 could implement any of various other features that are disclosed herein. For example, the decoder module 1906, the receiver module 1904, the code processing module 1910, and/or the pre-decoding processing module 1914 could be configured to implement any one or more of receiving/decoding features corresponding to encoding/transmitting features noted above.

Figure 20:
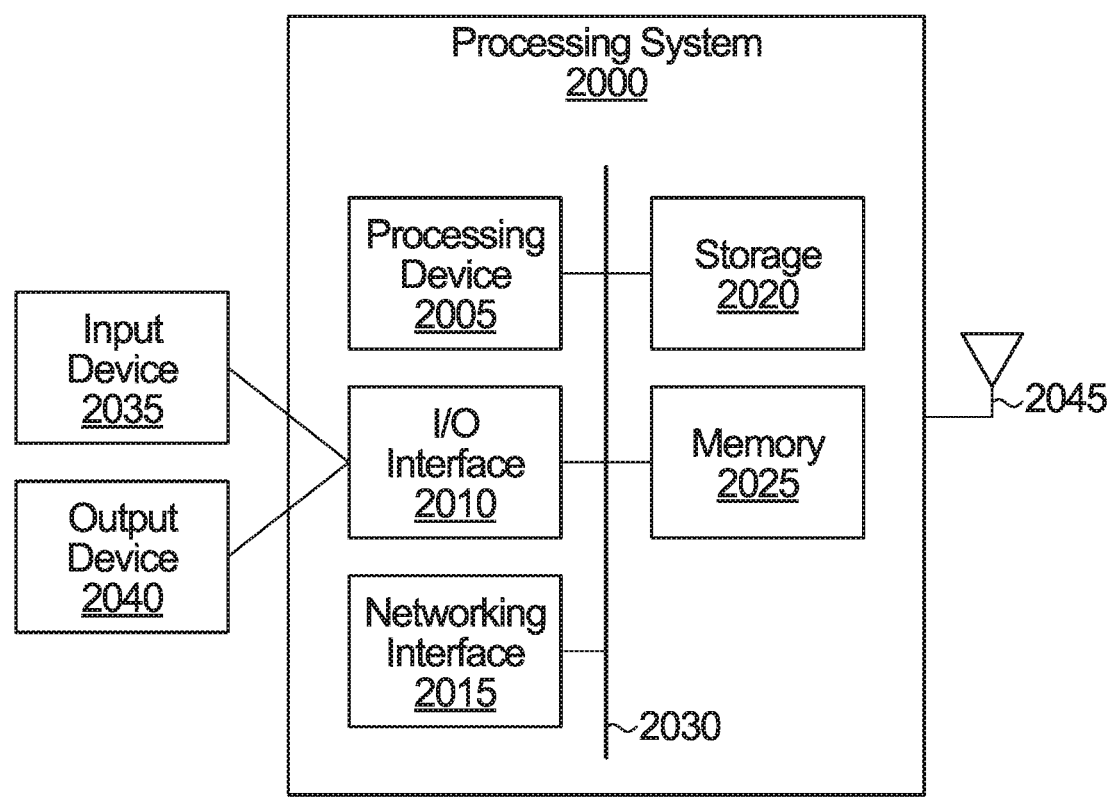
FIG. 20 is a block diagram of an example simplified processing system, which may be used to implement embodiments disclosed herein.

FIGS. 16 to 19 are generalized block diagrams of apparatus that could be used to implement embodiments disclosed herein. FIG. 20 is a block diagram of an example simplified processing system 2000, which may be used to implement embodiments disclosed herein, and provides a higher level implementation example. The apparatus 1600, the apparatus 1700, or both, may be implemented using the example processing system 2000, or variations of the processing system 2000. The processing system 2000 could be a server or a mobile device, for example, or any suitable processing system. Other processing systems suitable for implementing embodiments described in the present disclosure may be used, which may include components different from those discussed below. Although FIG. 20 shows a single instance of each component, there may be multiple instances of each component in the processing system 2000.

The processing system 2000 may include one or more processing devices 2005, such as a processor, a microprocessor, an ASIC, an FPGA, a dedicated logic circuitry, or combinations thereof. The processing system 2000 may also include one or more input/output (I/O) interfaces 2010, which may enable interfacing with one or more appropriate input devices 2035 and/or output devices 2040. The processing system 2000 may include one or more network interfaces 2015 for wired or wireless communication with a network (e.g., an intranet, the Internet, a P2P network, a WAN and/or a LAN) or other node. The network interfaces 2015 may include wired links (e.g., Ethernet cable) and/or wireless links (e.g., one or more antennas) for intra-network and/or inter-network communications. The network interfaces 2015 may provide wireless communication via one or more transmitters or transmit antennas and one or more receivers or receive antennas, for example. In this example, a single antenna 2045 is shown, which may serve as both transmitter and receiver. However, in other examples there may be separate antennas for transmitting and receiving. The processing system 2000 may also include one or more storage units 2020, which may include a mass storage unit such as a solid state drive, a hard disk drive, a magnetic disk drive and/or an optical disk drive.

The processing system 2000 may include one or more memories 2025, which may include a volatile or non-volatile memory (e.g., a flash memory, a random access memory (RAM), and/or a read-only memory (ROM)). The non-transitory memories 2025 may store instructions for execution by the processing devices 2005, such as to carry out examples described in the present disclosure. The memories 2025 may include other software instructions, such as for implementing an operating system and other applications/functions. In some examples, one or more data sets and/or modules may be provided by an external memory (e.g., an external drive in wired or wireless communication with the processing system 2000) or may be provided by a transitory or non-transitory computer-readable medium. Examples of non-transitory computer readable media include a RAM, a ROM, an erasable programmable ROM (EPROM), an electrically erasable programmable ROM (EEPROM), a flash memory, a CD-ROM, or other portable memory storage.

There may be a bus 2030 providing communication among components of the processing system 2000. The bus 2030 may be any suitable bus architecture including, for example, a memory bus, a peripheral bus or a video bus. In FIG. 20, the input devices 2035 (e.g., a keyboard, a mouse, a microphone, a touchscreen, and/or a keypad) and output devices 2040 (e.g., a display, a speaker and/or a printer) are shown as external to the processing system 2000. In other examples, one or more of the input devices 2035 and/or the output devices 2040 may be included as a component of the processing system 2000.

Figure 21:
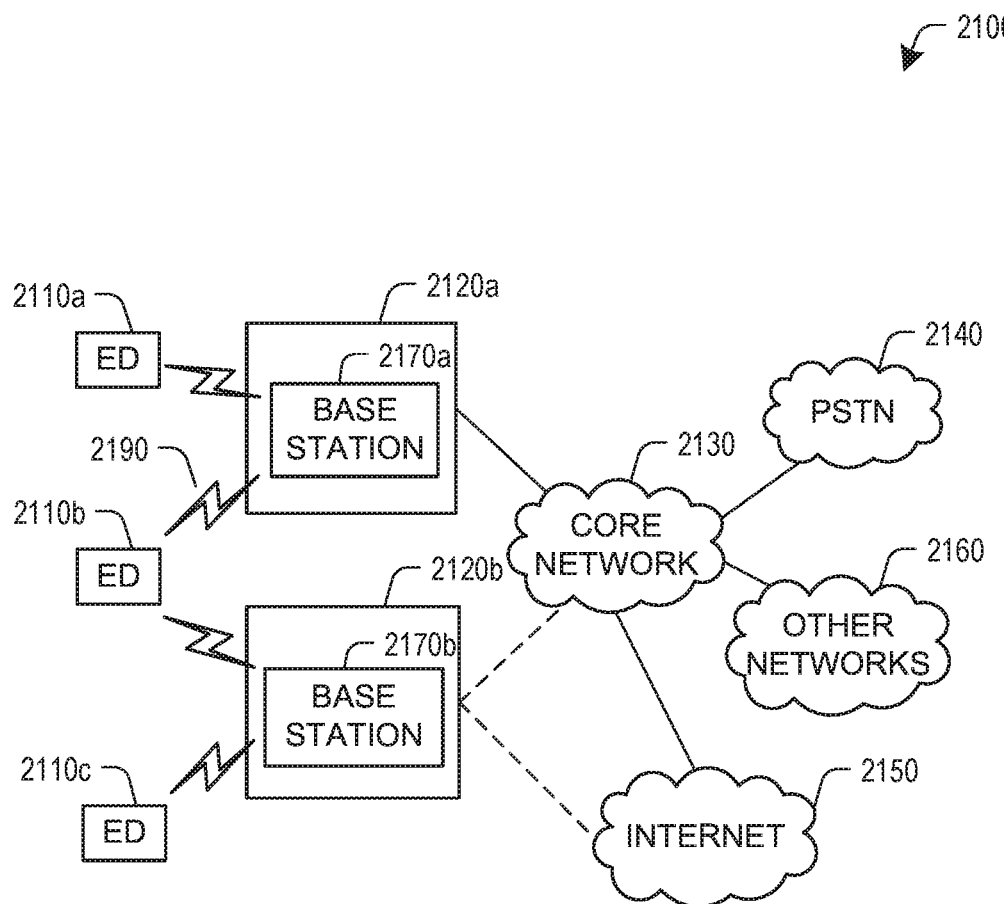
FIG. 21 illustrates an example communication system in which embodiments of the present disclosure could be implemented.

FIG. 21 illustrates an example communication system 2100 in which embodiments of the present disclosure could be implemented. In general, the communication system 2100 enables multiple wireless or wired elements to communicate data and other content. The purpose of the communication system 2100 may be to provide content (voice, data, video, text) via broadcast, narrowcast, user device to user device, etc. The communication system 2100 may operate by sharing resources such as bandwidth.

In this example, the communication system 2100 includes electronic devices (ED) 2110a-2110c, radio access networks (RANs) 2120a-2120b, a core network 2130, a public switched telephone network (PSTN) 2140, the internet 2150, and other networks 2160. Although certain numbers of these components or elements are shown in FIG. 21, any reasonable number of these components or elements may be included.

The EDs 2110a-2110c and base stations 2170a-2170b are examples of communication equipment that can be configured to implement some or all of the functionality and/or embodiments described herein. For example, any one of the EDs 2110a-2110c and base stations 2170a-2170b could be configured to implement the encoding or decoding functionality (or both) described above. In another example, any one of the EDs 2110a-2110c and base stations 2170a-2170b could include an apparatus 1600 (FIG. 16) or 1800 (FIG. 18), an apparatus 1700 (FIG. 17) or 1900 (FIG. 19), or both.

The EDs 2110a-2110c are configured to operate, communicate, or both, in the communication system 2100. For example, the EDs 2110a-2110c are configured to transmit, receive, or both via wireless or wired communication channels. Each ED 2110a-2110c represents any suitable end user device for wireless operation and may include such devices (or may be referred to) as a user equipment/device (UE), wireless transmit/receive unit (WTRU), mobile station, fixed or mobile subscriber unit, cellular telephone, station (STA), machine type communication (MTC) device, personal digital assistant (PDA), smartphone, laptop, computer, tablet, wireless sensor, or consumer electronics device.

In FIG. 21, the RANs 2120a-2120b include base stations 2170a-2170b, respectively. Each base station 2170a-2170b is configured to wirelessly interface with one or more of the EDs 2110a-2110c to enable access to any other base station 2170a-2170b, the core network 2130, the PSTN 2140, the Internet 2150, and/or the other networks 2160. For example, the base stations 2170a-2170b may include (or be) one or more of several well-known devices, such as a base transceiver station (BTS), a Node-B (NodeB), an evolved NodeB (eNodeB), a Home eNodeB, a gNodeB, a transmission point (TP), a site controller, an access point (AP), or a wireless router. Any ED 2110a-2110c may be alternatively or additionally configured to interface, access, or communicate with any other base station 2170a-2170b, the internet 2150, the core network 2130, the PSTN 2140, the other networks 2160, or any combination of the preceding. The communication system 2100 may include RANs, such as RAN 2120b, wherein the corresponding base station 2170b accesses the core network 2130 via the internet 2150, as shown.

The EDs 2110a-2110c and base stations 2170a-2170b are examples of communication equipment that can be configured to implement some or all of the functionality and/or embodiments described herein. In the embodiment shown in FIG. 21, the base station 2170a forms part of the RAN 2120a, which may include other base stations, base station controller(s) (BSC), radio network controller(s) (RNC), relay nodes, elements, and/or devices. Any base station 2170a, 2170b may be a single element, as shown, or multiple elements, distributed in the corresponding RAN, or otherwise. Also, the base station 2170b forms part of the RAN 2120b, which may include other base stations, elements, and/or devices. Each base station 2170a-2170b transmits and/or receives wireless signals within a particular geographic region or area, sometimes referred to as a "cell" or "coverage area". A cell may be further divided into cell sectors, and a base station 2170a-2170b may, for example, employ multiple transceivers to provide service to multiple sectors. In some embodiments, there may be established pico or femto cells where the radio access technology supports such. In some embodiments, multiple transceivers could be used for each cell, for example using multiple-input multiple-output (MIMO) technology. The number of RAN 2120a-2120b shown is exemplary only. Any number of RAN may be contemplated when devising the communication system 2100.

The base stations 2170a-2170b communicate with one or more of the EDs 2110a-2110c over one or more air interfaces 2190 using wireless communication links e.g. RF, microwave, infrared (IR), etc. The air interfaces 2190 may utilize any suitable radio access technology. For example, the communication system 2100 may implement one or more channel access methods, such as code division multiple access (COMA), time division multiple access (TDMA), frequency division multiple access (FDMA), orthogonal FDMA (OFDMA), or single-carrier FDMA (SC-FDMA) in the air interfaces 2190.

A base station 2170a-2170b may implement Universal Mobile Telecommunication System (UMTS) Terrestrial Radio Access (UTRA) to establish an air interface 2190 using wideband COMA (WCDMA). In doing so, the base station 2170a-2170b may implement protocols such as HSPA, HSPA+ optionally including HSDPA, HSUPA or both. Alternatively, a base station 2170a-2170b may establish an air interface 2190 with Evolved UTMS Terrestrial Radio Access (E-UTRA) using LTE, LTE-A, and/or LTE-B. It is contemplated that the communication system 2100 may use multiple channel access functionality, including such schemes as described above. Other radio technologies for implementing air interfaces include IEEE 802.11, 802.15, 802.16, CDMA2000, CDMA2000 1x, CDMA2000 EV-DO, IS-2000, IS-95, IS-856, GSM, EDGE, and GERAN. Of course, other multiple access schemes and wireless protocols may be utilized.

The RANs 2120a-2120b are in communication with the core network 2130 to provide the EDs 2110a-2110c with various services such as voice, data, and other services. The RANs 2120a-2120b and/or the core network 2130 may be in direct or indirect communication with one or more other RANs (not shown), which may or may not be directly served by core network 2130, and may or may not employ the same radio access technology as RAN 2120a, RAN 2120b or both. The core network 2130 may also serve as a gateway access between (i) the RANs 2120a-2120b or EDs 2110a-2110c or both, and (ii) other networks (such as the PSTN 2140, the internet 2150, and the other networks 2160). In addition, some or all of the EDs 2110a-2110c may include functionality for communicating with different wireless networks over different wireless links using different wireless technologies and/or protocols. Instead of wireless communication (or in addition thereto), the EDs 2110a-2110c may communicate via wired communication channels to a service provider or switch (not shown), and to the internet 2150. PSTN 2140 may include circuit switched telephone networks for providing plain old telephone service (POTS). Internet 2150 may include a network of computers and subnets (intranets) or both, and incorporate protocols, such as IP, TOP, UDP. EDs 2110a-2110c may be multimode devices capable of operation according to multiple radio access technologies, and incorporate multiple transceivers necessary to support such.

Figure 22A:
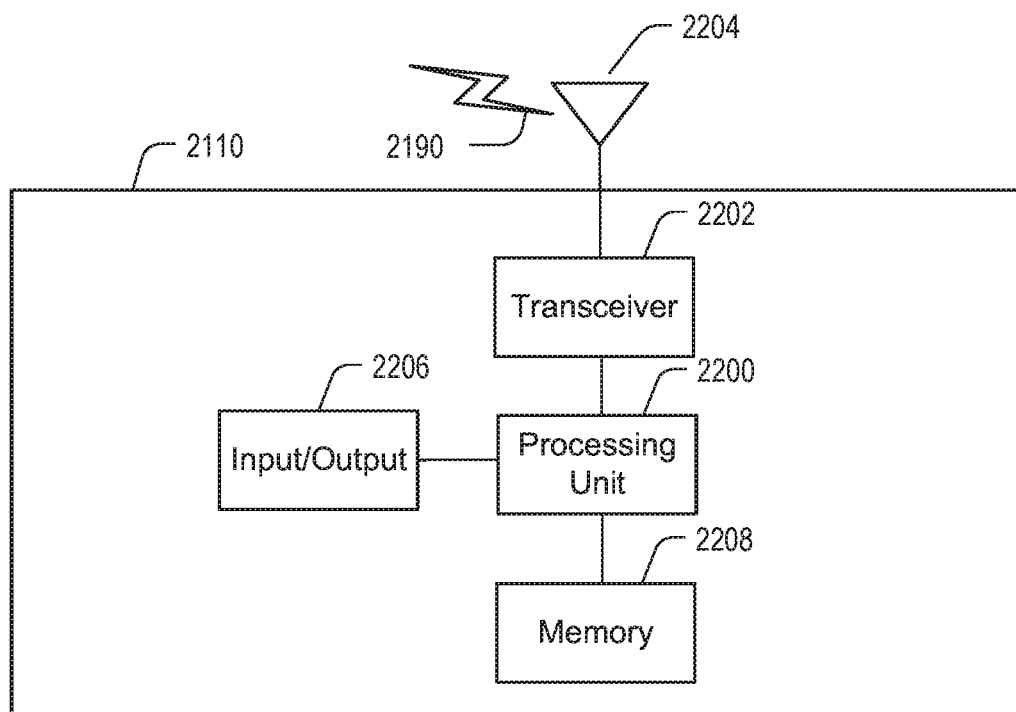
FIGS. 22A and 22B illustrate example devices that may implement the methods and teachings according to this disclosure.
Figure 22B:
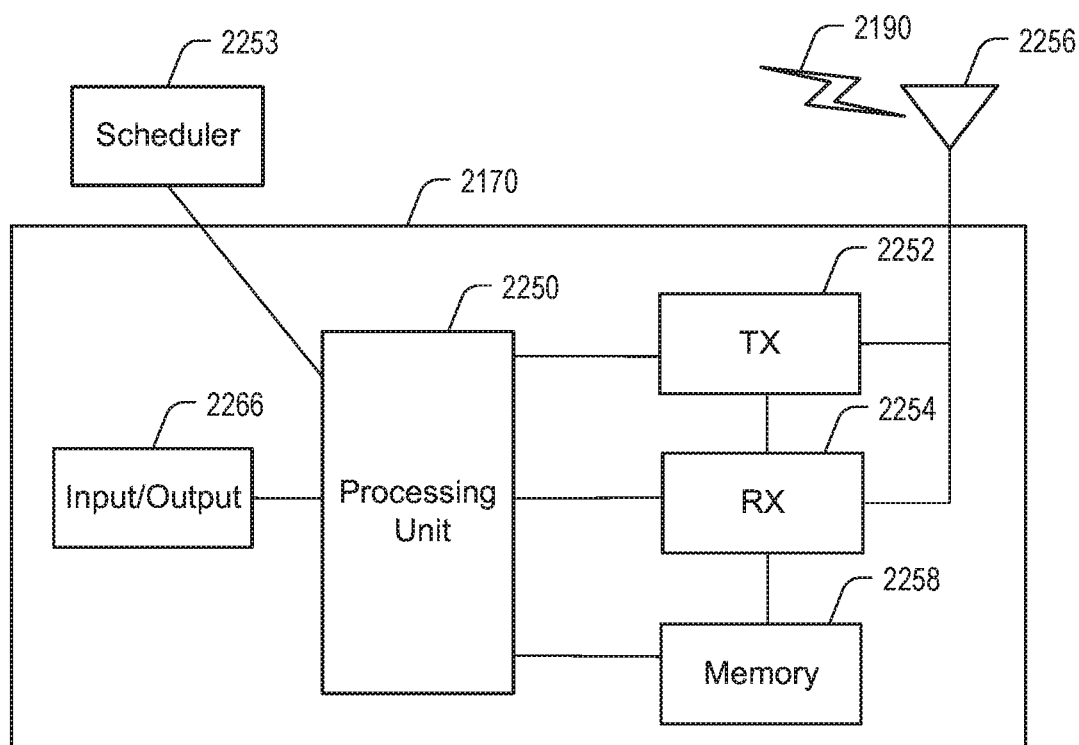

FIGS. 22A and 22B illustrate example devices that may implement the methods and teachings according to this disclosure. In particular, FIG. 22A illustrates an example ED 2110, and FIG. 22B illustrates an example base station 2170. These components could be used in the communication system 2100 or in any other suitable system.

As shown in FIG. 22A, the ED 2110 includes at least one processing unit 2200. The processing unit 2200 implements various processing operations of the ED 2110. For example, the processing unit 2200 could perform signal coding, data processing, power control, input/output processing, or any other functionality enabling the ED 2110 to operate in the communication system 2100. The processing unit 2200 may also be configured to implement some or all of the functionality and/or embodiments described in more detail above. Each processing unit 2200 includes any suitable processing or computing device configured to perform one or more operations. Each processing unit 2200 could, for example, include a microprocessor, microcontroller, digital signal processor, field programmable gate array, or application specific integrated circuit.

The ED 2110 also includes at least one transceiver 2202. The transceiver 2202 is configured to modulate data or other content for transmission by at least one antenna or Network Interface Controller (NIC) 2204. The transceiver 2202 is also configured to demodulate data or other content received by the at least one antenna 2204. Each transceiver 2202 includes any suitable structure for generating signals for wireless or wired transmission and/or processing signals received wirelessly or by wire. Each antenna 2204 includes any suitable structure for transmitting and/or receiving wireless or wired signals. One or multiple transceivers 2202 could be used in the ED 2110, and one or multiple antennas 2204 could be used in the ED 2110. Although shown as a single functional unit, a transceiver 2202 could also be implemented using at least one transmitter and at least one separate receiver.

The ED 2110 further includes one or more input/output devices 2206 or interfaces (such as a wired interface to the internet 2150). The input/output devices 2206 permit interaction with a user or other devices in the network. Each input/output device 2206 includes any suitable structure for providing information to or receiving information from a user, such as a speaker, microphone, keypad, keyboard, display, or touch screen, including network interface communications.

In addition, the ED 2110 includes at least one memory 2208. The memory 2208 stores instructions and data used, generated, or collected by the ED 2110. For example, the memory 2208 could store software instructions or modules configured to implement some or all of the functionality and/or embodiments described above and that are executed by the processing unit(s) 2200. Each memory 2208 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

As shown in FIG. 22B, the base station 2170 includes at least one processing unit 2250, at least one transmitter 2252, at least one receiver 2254, one or more antennas 2256, at least one memory 2258, and one or more input/output devices or interfaces 2266. A transceiver, not shown, may be used instead of the transmitter 2252 and receiver 2254. A scheduler 2253 may be coupled to the processing unit 2250. The scheduler 2253 may be included within or operated separately from the base station 2170. The processing unit 2250 implements various processing operations of the base station 2170, such as signal coding, data processing, power control, input/output processing, or any other functionality. The processing unit 2250 can also be configured to implement some or all of the functionality and/or embodiments described in more detail above. Each processing unit 2250 includes any suitable processing or computing device configured to perform one or more operations. Each processing unit 2250 could, for example, include a microprocessor, microcontroller, digital signal processor, field programmable gate array, or application specific integrated circuit.

Each transmitter 2252 includes any suitable structure for generating signals for wireless or wired transmission to one or more EDs or other devices. Each receiver 2254 includes any suitable structure for processing signals received wirelessly or by wire from one or more EDs or other devices. Although shown as separate components, at least one transmitter 2252 and at least one receiver 2254 could be combined into a transceiver. Each antenna 2256 includes any suitable structure for transmitting and/or receiving wireless or wired signals. Although a common antenna 2256 is shown here as being coupled to both the transmitter 2252 and the receiver 2254, one or more antennas 2256 could be coupled to the transmitter(s) 2252, and one or more separate antennas 2256 could be coupled to the receiver(s) 2254. Each memory 2258 includes any suitable volatile and/or non-volatile storage and retrieval device(s) such as those described above in connection to the ED 2110. The memory 2258 stores instructions and data used, generated, or collected by the base station 2170. For example, the memory 2258 could store software instructions or modules configured to implement some or all of the functionality and/or embodiments described above and that are executed by the processing unit(s) 2250.

Each input/output device 2266 permits interaction with a user or other devices in the network. Each input/output device 2266 includes any suitable structure for providing information to or receiving/providing information from a user, including network interface communications.

The embodiments described with reference to FIGS. 16 to 22 relate to example apparatus. Method embodiments, for decoding and/or encoding, are also contemplated.

Figure 23:
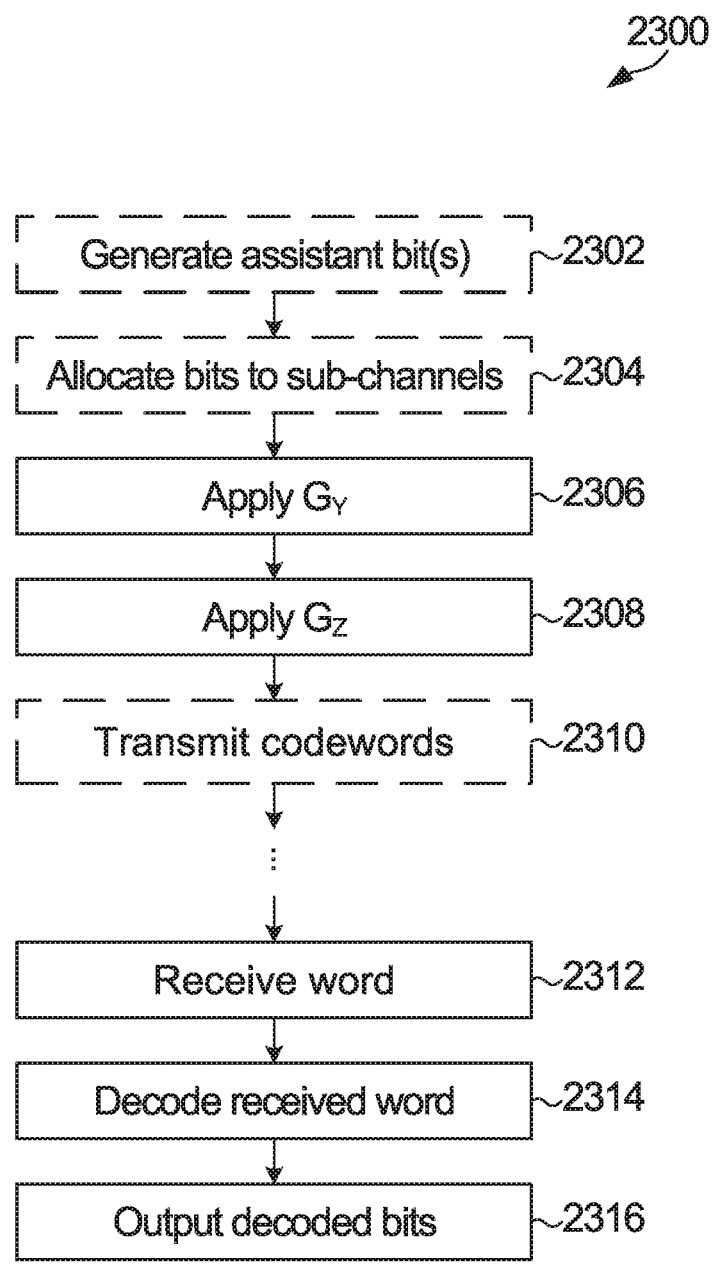
FIG. 23 is a flow diagram of an example coding method according to another embodiment.

FIG. 23 is a flow diagram of an example coding method according to another embodiment. The illustrated example method 2300 includes generating assistant bits at 2302, which might not be performed in all embodiments. Information bits and frozen bits, and assistant bits if used, are allocated to sub-channels at 2304. This is equivalent to sub-channel selection. Bits are encoded into codewords that include coded bits. In an embodiment, this involves applying $G_Y$ of prime number dimension Y to the input bits in a first stage, and applying a polar encoding kernel matrix $G_Z$ of prime number dimension Z to the output bits from the first stage. In another embodiment, the encoding involves applying a first plurality of polar encoding matrices $G_Y$ of prime number dimension Y to the input bits to produce output bits, and applying a second plurality of polar encoding matrices $G_Z$ of prime number dimension Z to the output bits to produce a codeword.

Application of matrices $G_Y$ and $G_Z$ are shown at 2306, 2308. The codewords are then transmitted at 2310.

FIG. 23 also shows example operations that are performed at a receiver/decoder. A word that is based on a codeword of a polar code is received at 2312 and decoded and 2314, and decoded bits are output at 2316. The decoding could use assistant bits as disclosed herein.

The example method in FIG. 23 is intended for illustrative purposes. Other embodiments could involve performing the illustrated operations in any of various ways, performing fewer or additional operations, and/or varying the order in which operations are performed. Other variations could be or become apparent to a skilled person based on the present disclosure.

For example, any one or more of the following could be provided, alone or in any of various combinations, in embodiments:

Y=Z;

Y is different from Z;

at least one of Y and Z is greater than two;

at least one of $G_Y$ and $G_Z$ is non-binary and is applied to multi-bit symbols;

$G_Y$ and $G_Z$ define sub-channels, and the method involves selecting, based on an ordered sequence of the sub-channels such as a nested and SNR independent ordered sequence of the sub-channels, sub-channels to code information bits in the input bits;

the selecting involves selecting K sub-channels, in an order of increasing or decreasing reliability for example, from an ordered sequence of the sub-channels, which includes N max sub-channels in an embodiment;

$G_Y$ and $G_Z$ define sub-channels, and the involves selecting, based on a sub-channel polarization reliability metric and at least one additional second metric, particular ones of the sub-channels to code particular bits in the input bits, such as sub-channels to code assistant bits in the input bits;

the at least one second metric comprises any one or more of: a hamming weight, a row weight, and a natural order of the sub-channels;

the particular bits are assistant bits to assist in decoding;

the assistant bits are for error detection/path selection in a decoder;

the assistant bits comprise one or more of: parity check, checksum, and CRC bits;

the particular ones of the sub-channels are consecutive sub-channels or sub-channels scattered in a sub-channel space;

selecting, based on the sub-channel polarization reliability metric, either or both of most reliable sub-channels to code information bits in the input bits, and least reliable sub-channels to code frozen bits;

$G_Y$ and $G_Z$ define sub-channels, and the method involves selecting, based on sub-channels affected by operations that are to be performed on coded bits, particular ones of the sub-channels to code particular bits in the input bits;

$G_Y$ and $G_Z$ define sub-channels, and the method involves selecting particular ones of the sub-channels to code particular bits in the input bits, and selecting, based on the selected sub-channels, coded bits for further processing operations;

applying a third plurality of polar encoding matrices of third prime number dimension, and applying a fourth plurality of polar encoding matrices of fourth prime number dimension;

applying a higher dimension matrix that is based on a combination of the first plurality of polar encoding matrices $G_Y$ and the second plurality of polar encoding matrices $G_Z$ and that has a dimension higher than Y and Z;

applying a further higher dimension matrix that is based on a combination of a third plurality of polar encoding matrices of a third prime number dimension and a fourth plurality of polar encoding matrices of a fourth prime number dimension, the further higher dimension matrix having a dimension greater than the third prime number and the fourth prime number.

In another embodiment, a non-transitory processor-readable medium stores instructions which, when executed by one or more processors, cause the one or more processors to perform a method as disclosed herein.

The previous description of some embodiments is provided to enable any person skilled in the art to make or use an apparatus, method, or processor readable medium according to the present disclosure.

Various modifications to the embodiments described herein may be readily apparent to those skilled in the art, and the generic principles of the methods and devices described herein may be applied to other embodiments. Thus, the present disclosure is not intended to be limited to the embodiments shown herein but is to be accorded the widest scope consistent with the principles and novel features disclosed herein.

For example, although embodiments are described primarily with reference to bits, other embodiments may involve non-binary multi-bit symbols.

It should also be appreciated that the present disclosure encompasses several aspects of polar coding, including kernel design, reliabilities and selection of sub-channels for code construction, non-CRC-aided error correction, and code shortening and puncturing. These aspects could be implemented separately, or together in any of various combinations of two or more of these aspects.

As noted above, polar codes have been selected for uplink and downlink eMBB control channel coding for the new 5G air interface, also known as 5G new radio (NR). The techniques disclosed herein could be used not only for control data over a control channel but also or instead other types of data (e.g. user data) over any type of channel (e.g. a data channel).

Illustrative examples described herein refer to sub-channel sequences that are in increasing order of a reliability metric. In other embodiments, ordered sequences that are in decreasing reliability order could be used. Similarly, sequences could be generated in increasing order of reliability rather than starting with more reliable channels and building a sequence by adding sub-channels with progressively decreasing reliabilities.

Additional example embodiments are also described below.

Input bits could be encoded into codewords that include coded bits. In an embodiment, encoding involves applying a polar encoding kernel matrix $G_Y$ of prime number dimension Y to the input bits in a first stage, and applying a polar encoding kernel matrix $G_Z$ of prime number dimension Z to the output bits from the first stage. One or both of $G_X$ and $G_Y$ could be non-2-by-2. Such kernel design and other aspects of code construction, including reliabilities and selection of sub-channels for code construction, non-CRC-aided error correction, and code shortening and puncturing, could be implemented in other embodiments as discussed in further detail herein.

The invention claimed is:

1. An apparatus comprising:
an encoder to apply a first plurality of Y-by-Y polar encoding matrices $G_Y$ of prime number dimension Y to input bits to produce output bits, and to apply a second plurality of polar Z-by-Z encoding matrices $G_Z$ of prime number dimension Z to the output bits to produce a codeword with coded bits, Y and Z being prime numbers;

a transmitter, coupled to the encoder, to transmit the codeword.

2. The apparatus of claim 1, wherein Y=Z.

3. The apparatus of claim 1, wherein Y is different from Z.

4. The apparatus of claim 1, wherein at least one of Y and Z is greater than two.

5. The apparatus of claim 1, wherein at least one of $G_Y$ and $G_Z$ is non-binary and is applied to multi-bit symbols.

6. The apparatus of claim 1, wherein $G_Y$ and $G_Z$ define sub-channels, and wherein the encoder further comprises a sub-channel selector to select, based on an ordered sequence of the sub-channels, sub-channels to code information bits in the input bits.

7. The apparatus of claim 6, wherein the sub-channel selector is configured to select K sub-channels from the ordered sequence of the sub-channels.

8. The apparatus of claim 1, wherein $G_Y$ and $G_Z$ define sub-channels, and wherein the encoder further comprises a sub-channel selector to select, based on a sub-channel polarization reliability metric and at least one additional second metric, sub-channels to code assistant bits in the input bits.

9. The apparatus of claim 8, wherein the sub-channel selector is further configured to select, based on the sub-channel polarization reliability metric, either or both of most reliable sub-channels to code information bits in the input bits, and least reliable sub-channels to code frozen bits.

10. The apparatus of claim 1, wherein the encoder is further configured to apply a third plurality of polar encoding matrices of third prime number dimension, and to apply a fourth plurality of polar encoding matrices of fourth prime number dimension.

11. The apparatus of claim 1, wherein the encoder is configured to apply a higher dimension matrix that is based on a combination of the first plurality of polar encoding matrices $G_Y$ and the second plurality of polar encoding matrices $G_Z$ and that has a dimension higher than Y and Z.

12. The apparatus of claim 11, wherein the encoder is further configured to apply a further higher dimension matrix that is based on a combination of a third plurality of polar encoding matrices of a third prime number dimension and a fourth plurality of polar encoding matrices of a fourth prime number dimension, the further higher dimension matrix having a dimension greater than the third prime number and the fourth prime number.

13. A method comprising:

encoding input bits into a codeword comprising coded bits, the encoding comprising applying a first plurality of Y-by-Y polar encoding matrices $G_Y$ of prime number dimension Y to the input bits to produce output bits, applying a second plurality of Z-by-Z polar encoding matrices $G_Z$ of prime number dimension Z to the output bits to produce the codeword, Y and Z being prime numbers; and transmitting the codeword.

14. The method of claim 13, wherein Y=Z.

15. The method of claim 13, wherein Y is different from Z.

16. The method of claim 13, wherein at least one of Y and Z is greater than two.

17. The method of claim 13, wherein at least one of $G_Y$ and $G_Z$ is non-binary and is applied to multi-bit symbols.

18. The method of claim 13, wherein $G_Y$ and $G_Z$ define sub-channels, and wherein the method further comprises selecting, based on an ordered sequence of the sub-channels, sub-channels to code information bits in the input bits.

19. The method of claim 18, wherein the selecting comprises selecting K sub-channels from the ordered sequence of the sub-channels.

20. The method of claim 13, wherein $G_Y$ and $G_Z$ define sub-channels, and wherein the method further comprises selecting, based on a sub-channel polarization reliability metric and at least one additional second metric, sub-channels to code assistant bits in the input bits.

21. The method of claim 20, wherein further comprising:

selecting, based on the sub-channel polarization reliability metric, either or both of most reliable sub-channels to code information bits in the input bits, and least reliable sub-channels to code frozen bits.

22. The method of claim 13, wherein the encoding further comprises:

applying a third plurality of polar encoding matrices of third prime number dimension, and applying a fourth plurality of polar encoding matrices of fourth prime number dimension.

23. The method of claim 13, wherein the encoding comprises:

applying a higher dimension matrix that is based on a combination of the first plurality of polar encoding matrices $G_Y$ and the second plurality of polar encoding matrices $G_Z$ and that has a dimension higher than Y and Z.

24. The method of claim 23, wherein the encoding further comprises:

applying a further higher dimension matrix that is based on a combination of a third plurality of polar encoding matrices of a third prime number dimension and a fourth plurality of polar encoding matrices of a fourth prime number dimension, the further higher dimension matrix having a dimension greater than the third prime number and the fourth prime number.

25. User equipment comprising the apparatus of claim 1.

26. Communication network equipment comprising the apparatus of claim 1.

27. A non-transitory processor-readable medium storing instructions which, when executed by one or more processors, cause the one or more processors to perform a method, the method comprising:

encoding input bits into a codeword comprising coded bits, the encoding comprising applying a first plurality of Y-by-Y polar encoding matrices $G_Y$ of prime number dimension Y to the input bits to produce output bits, applying a second plurality of Z-by-Z polar encoding matrices $G_Z$ of prime number dimension Z to the output bits to produce the codeword, Y and Z being prime numbers; and transmitting the codeword.

* * * * *